(12) United States Patent
Soskind et al.

(10) Patent No.: US 10,732,422 B2
(45) Date of Patent: Aug. 4, 2020

(54) ELECTROMAGNETIC RADIATION ENHANCEMENT METHODS AND SYSTEMS

(71) Applicants: Yakov G. Soskind, Plainsboro, NJ (US); Michael G. Soskind, Plainsboro, NJ (US); Rose A. Soskind, Plainsboro, NJ (US)

(72) Inventors: Yakov G. Soskind, Plainsboro, NJ (US); Michael G. Soskind, Plainsboro, NJ (US); Rose A. Soskind, Plainsboro, NJ (US)

( * ) Notice: Subject to any disclaimer, the term of this patent is extended or adjusted under 35 U.S.C. 154(b) by 3 days.

(21) Appl. No.: 16/239,838

(22) Filed: Jan. 4, 2019

(65) Prior Publication Data

US 2019/0137769 A1 May 9, 2019

Related U.S. Application Data

(62) Division of application No. 14/159,257, filed on Jan. 20, 2014, now Pat. No. 10,209,526.

(51) Int. Cl.
*G02B 27/09* (2006.01)
*G03F 7/20* (2006.01)
*G02B 5/30* (2006.01)

(52) U.S. Cl.
CPC ..... *G02B 27/0927* (2013.01); *G02B 27/0955* (2013.01); *G02B 27/0983* (2013.01);
(Continued)

(58) Field of Classification Search
CPC ............ G02B 27/0927; G02B 27/0955; G02B 27/0983; G02B 27/0988; G02B 5/3083;
(Continued)

(56) References Cited

U.S. PATENT DOCUMENTS

| 3,571,603 A | * | 3/1971 | Bryant | ................... G02B 27/46 |
| | | | | 250/550 |
| 4,947,413 A | * | 8/1990 | Jewell | ................. G03F 7/70325 |
| | | | | 378/34 |

(Continued)

OTHER PUBLICATIONS

M. Born and E. Wolf, "Principles of Optics", Cambridge University Press, 7th Edition, pp. 119 and 141, 1999 (2 pages total).

(Continued)

*Primary Examiner* — Collin X Beatty
(74) *Attorney, Agent, or Firm* — Stuart H. Mayer; Mayer & Williams PC

(57) ABSTRACT

An optical system for producing electromagnetic radiation with localized increases in irradiance or radiance at the system output includes a first optical mask containing localized regions for producing controlled modifications of phase delays and/or amplitude attenuations and located within the input plane of said optical system. The system also includes at least a single optical component with positive optical power located after the input plane and at least one additional optical mask located after the optical component at non-conjugate locations with respect to the input plane of the system. The additional optical mask contains localized regions for producing controlled modifications of phase delays. Locally increased radiation distributions are produced at the system output.

25 Claims, 23 Drawing Sheets

(52) U.S. Cl.
CPC ..... *G02B 27/0988* (2013.01); *G03F 7/70325* (2013.01); *G02B 5/3083* (2013.01); *G02B 5/3091* (2013.01)

(58) Field of Classification Search
CPC .. G02B 5/3091; G02B 27/0075; G02B 27/46; G02B 27/52; G03F 7/70325; G03F 7/70291; G03F 7/7005; G03F 7/70358; G03F 1/144; G03F 7/70125; G03F 7/70425; G03F 7/70441; G03F 1/14; G03F 1/32; G03F 1/34; G03F 1/36; G03F 7/70158; G03F 7/70258; G03F 7/70283; G03F 7/70308; G03F 7/70341; G03F 7/70408; G03F 7/70508
USPC ........ 430/5, 394, 396; 359/305, 1, 238, 350, 359/637; 716/50; 438/551, 553, 671, 438/717, 736, 942, 943, 945, 947, 950
See application file for complete search history.

(56) References Cited

U.S. PATENT DOCUMENTS

| | | |
|---|---|---|
| 5,482,801 A | 1/1996 | Smith |
| 5,928,813 A | 7/1999 | Krivokapic |
| 6,621,628 B1 | 9/2003 | Ogino |
| 6,855,486 B1 | 2/2005 | Finders |
| 6,977,127 B2 | 12/2005 | Shiah |
| RE40,084 E | 2/2008 | Petersen |
| 7,514,183 B2 | 4/2009 | Hsu |
| 7,697,191 B2 | 4/2010 | Gluckstad |
| 8,164,612 B2 | 4/2012 | Imai et al. |
| 8,277,060 B2 | 10/2012 | Cook |
| 2004/0125454 A1 | 7/2004 | Kawasaki |
| 2005/0275818 A1 | 12/2005 | Singer |
| 2006/0115752 A1 | 6/2006 | Latypov |
| 2007/0263269 A1 | 11/2007 | Flagello |
| 2008/0206685 A1 | 8/2008 | Shiraishi |
| 2008/0286661 A1 | 11/2008 | Misaka |

OTHER PUBLICATIONS

Y. Soskind, "Field Guide to Diffractive Optics", FG21, SPIE Press, pp. 39-46, 2011 (5 pages total).

Marc D. Levenson, N.S. Viswanathan, Robert A. Simpson. Improving Resolution with a Phase-Shifting Mask. IEEE Transactions on Electron Devices. vol. Ed-29, No. 12, Dec. 1982.

Born and Wolf. Principles of Optics. 1970; notably "Fraunhofer Diffraction in Optical Instruments".

David Griffiths. Introduction to Electrodynamics. p. 367, "Sinusoidal Waves". Prentice-Hall, 1999.

Mordechai Rothschild. Projection optical lithography. Materials Today, Feb. 2005.

\* cited by examiner

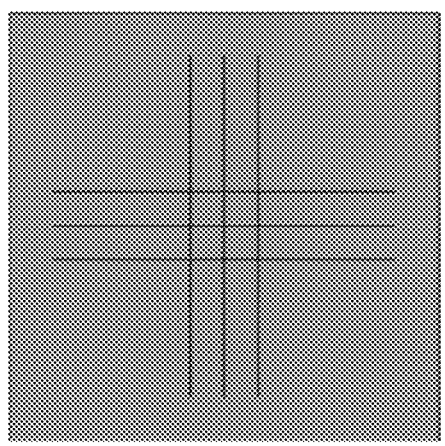
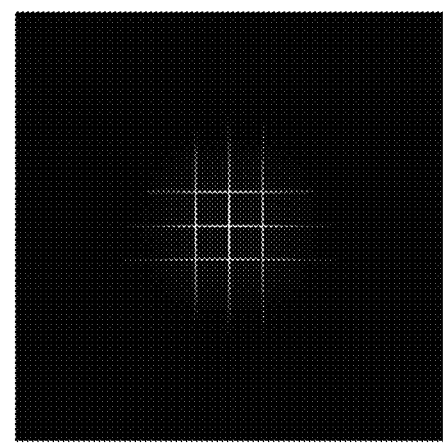
Figure 30                                          Figure 31
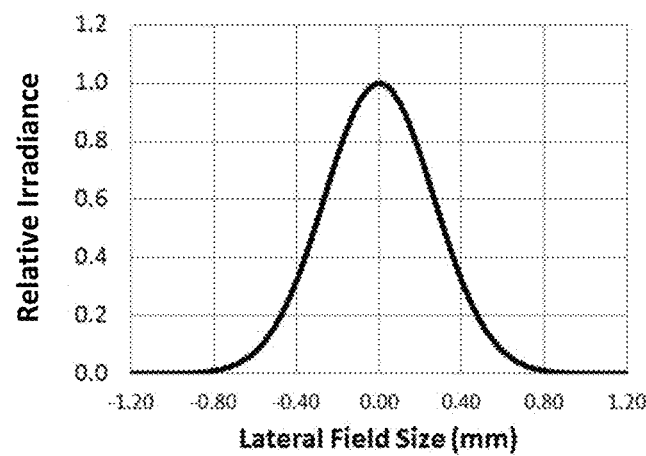
Figure 32
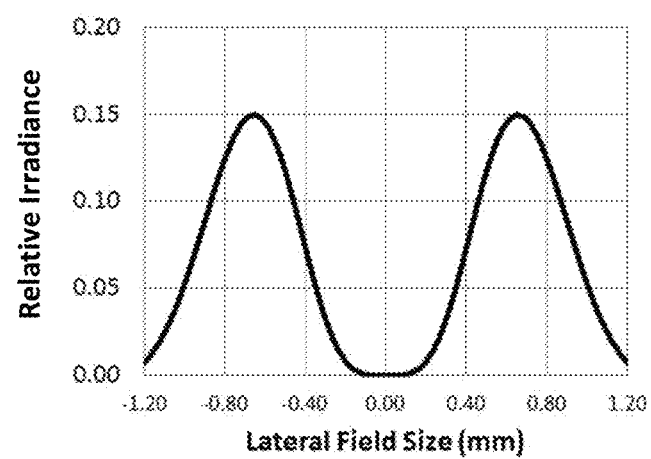
Figure 33

ELECTROMAGNETIC RADIATION ENHANCEMENT METHODS AND SYSTEMS

CROSS REFERENCE TO RELATED APPLICATIONS

This application is a divisional of U.S. patent application Ser. No. 14/159,257, filed Jan. 20, 2014, entitled, "Electromagnetic Radiation Enhancement Methods and Systems", the contents of which are incorporated by reference in its entirety.

FIELD OF THE INVENTION

The present invention relates to methods and systems employed to locally enhance the strength of electromagnetic radiation. More specifically, it relates to methods and optical systems that produce localized increases in irradiance or radiance of electromagnetic radiation achieved through the employment of controlled amplitude attenuations and phase delays.

BACKGROUND OF THE INVENTION

In many applications, high output radiance and small angular divergence of the electromagnetic radiation are required for achieving key performance characteristics of the systems, such as high signal-to-noise ratios or low error signals.

Several other photonics applications, including confocal scanning microscopy, optical coherence tomography (OCT), step-and-scan lithography, materials processing, multi-photon excitation, and manipulation of micro-particles and biological cells, require the generation of electromagnetic radiation that can produce high peak irradiance distributions with small lateral dimensions at the objects located in the relative proximity. In a confocal scanning microscopy or OCT system, a narrow width laser beam is scanned in the object plane. The reconstructed details in the OCT images are based on the detection of the reflected or transmitted signals, and depend on the lateral dimensions of the scanned beam. The lateral resolution of the microscope or OCT system also depends on the width of the laser beam in the object plane. The beam is scanned across the object plane to reconstruct the spatial details of the object being tested, and therefore smaller sized beams are required to increase the resolution in scanning microscopy and OCT systems. Similarly, in optical data storage applications, the storage density depends on how tightly the information is recorded on the disk. The density of the information recorded is inversely proportional to the width of the focused laser central intensity node. In optical step-and-scan lithography applications, small-sized beams or radiation patterns are projected onto the surface of a photoresist and then lateral scans are performed across the photoresist surface. The scans are followed by subsequent lateral steps to the un-exposed areas of the photoresist across the wafer, where the photoresist exposure is repeated in the form of the lateral scans. In all of the above applications, high peak irradiance and small lateral size of the electromagnetic radiation are crucially important since they directly affect the key performance characteristics of the systems, such as the signal-to-noise ratio in reconstructed images, or the minimum feature sizes achievable during the lithographic process. It is therefore desirable to establish techniques for producing electromagnetic radiation with narrow widths and high peak irradiance distributions. In addition, the produced electromagnetic radiation often needs to be controlled in size, lateral position, divergence, direction of propagation, and shape.

A traditional technique employed in generating a high intensity small size electromagnetic field distribution is based on focusing an electromagnetic radiation with a high quality lens well corrected for aberrations. The size of the resulting pattern in the focal plane is limited primarily by diffraction. The resultant field distribution of the diffraction limited lens is called an Airy pattern, and the diameter of the central peak irradiance spot of the pattern, referred to as an Airy disk, is defined as:

$$d_{Airy} = 2.44 \frac{\lambda f}{D} = 2.44 \lambda N \qquad (1)$$

where $\lambda$ is the wavelength of the electromagnetic radiation, D is the lens aperture diameter, and f is the focal length of the focusing lens. The ratio $N=f/D$ is referred to in literature as the f-number of an optical system. For a given wavelength of electromagnetic radiation, a reduction in the Airy disk size produced by a diffraction limited lens can be achieved only by reducing the f-number. Unfortunately, a reduction in the f-number of a lens is associated with a progressive increase in the lens size, complexity, and cost, as well as an increase in optical aberrations due to lens imperfections. At certain f-number values of a lens, the Airy disk size reduction is no longer practical. In addition, focusing of the electromagnetic radiation provides a very limited ability to alter the shape of the electromagnetic field distribution.

Amplitude and phase masks have been employed in the past to reduce the size of an Airy disk, or a diffraction limited system response to a point source known as a point-spread function (PSF). The idea of using phase masks located at the pupil of an optical system to reduce the Airy disk width was first proposed by Toraldo di Francia in 1952. Since then, it has been demonstrated that amplitude and phase masks placed at the pupil of an optical system alter the system's PSF. Several examples of PSF distributions produced with the aid of amplitude and phase masks may be found in Y. Soskind, "Field Guide to Diffractive Optics", SPIE Press, 2011, for example on pages 15 through 16, and 29 through 35. By an appropriate selection of the amplitude and phase mask properties, the PSF size can be reduced below the size of the Airy disk value defined by equation (1). Techniques that lead to a reduction in PSF size below that of an Airy disk value are termed as super resolution techniques.

In a similar manner, employment of a phase mask within an optical system may reduce the width of a propagating laser beam. S. Imai and S. Suzuki in U.S. Pat. No. 8,164,612 disclosed a laser scanning apparatus that employs a laser source in conjunction with a single phase mask to produce super-resolved beams with the central core width less than the width of the beam when the phase mask is not present in U.S. Pat. No. 8,164,612. The major drawback of the designs disclosed in U.S. Pat. No. 8,164,612 is that there is only a marginal reduction in the width of the produced laser beam, on the order of 10%-20%. In many applications, significantly narrower output beam widths are desirable.

The employment of phase masks to shape the PSF of an optical system or the field distribution of a laser beam may have other drawbacks. It was shown by M. Soskind et. al. that for propagating Gaussian beams, the amount of energy contained within the central core of a super resolved beam produced employing amplitude and phase masks is progressively reduced with a decrease in the beam width, while the energy contained in the diffraction lobes outside of the central core is progressively increased (see, Soskind et al. 2010).

FIG. 1 presents changes in the central core diameter, the power outside of the central core, and the power contained in the central core for an optical system with central obscurations produced by an opaque, axially-symmetric amplitude mask located at the pupil of the optical system. An increase in pupil obscuration by the amplitude mask leads to a reduction in the output central core diameter, and at the same time causes a reduction in the power contained in the central core.

Phase masks located at the pupil of the system are also used to alter the shape of the PSF. The optical path difference (OPD) introduced by phase mask structures is chosen to be equal to an odd integer j of half the wavelength $\lambda/2$ of the electromagnetic radiation:

$$OPD = j\frac{\lambda}{2} \quad (2)$$

In many cases, the lowest integer value j=1 is employed, and the optical path difference introduced by the phase masks is equal to half the wavelength of the electromagnetic radiation.

FIG. 2 presents normalized PSF cross-sections for an Airy distribution, as well as for optical systems with phase masks having four different radial zone sizes. The figure shows that the shape of the central core and the diffraction rings of the resulting PSF can be altered by changing the phase mask radius.

FIG. 3 presents the relative peak values of the PSF cross-sections for an Airy distribution, as well as for optical systems with the four pupil mask radial sizes shown in FIG. 2. The peak irradiance of the Airy distribution exceeds the PSF peak values of the systems employing phase masks, as shown in FIG. 3.

The ratio of the PSF peak irradiance of an optical system, in this case employing amplitude or phase masks, to the peak irradiance of an Airy distribution is known as the Strehl ratio. FIG. 4 presents the calculated Strehl ratios for optical systems with amplitude and phase masks located at the systems' pupils as a function of the masks' radial sizes. The figure indicates that the use of amplitude or phase masks to alter the PSF shape of an optical system is associated with a reduction in the Strehl ratio. The use of amplitude or phase masks located at the pupil of an optical system to alter the PSF of the system cannot significantly enhance the peak irradiance of the resulting PSF over the peak value of the diffraction limited Airy distribution.

Optical scanning mechanisms are traditionally employed to adjust the spatial location of high peak irradiance distributions in the output plane. A combination of two independently controlled mirrors and an f-theta lens represent an example of a typical scanning mechanism. An example of a two-mirror scanning unit is disclosed, for example, in U.S. Pat. No. 6,621,628.

The addition of the scanning mechanism increases the complexity of an optical system, and may also lead to reduced output peak irradiance due to imperfections and misalignments introduced by the scanner components.

Traditional optical scanning mechanisms are based on mechanical moving components, such as the aforementioned pair of galvanometric mirrors. The response time of the mechanical scanners generally depends on the physical size of the moving parts and is limited by the inertia of the moving parts. The response time of the fastest mechanical scanners is within a range of several milliseconds, corresponding to linear scan rates of several hundreds of hertz. Acquisition time in scanning microscopy or OCT systems is proportional to the scanner response time. To reduce the acquisition time, it is therefore desirable to employ scanning techniques that do not require mechanical moving parts for their implementation. It is therefore highly desirable to establish electronically controlled scanning techniques that do not rely on mechanical moving parts for their implementation, and that are capable of producing scan rates above the rates of mechanical scanners.

In view of the foregoing, it would be desirable to provide electromagnetic radiation enhancement techniques employing amplitude and phase masks that can produce high peak irradiance distributions in the output plane and will not suffer from a reduction in the Strehl ratio of the resulting field.

It would also be desirable to provide electromagnetic radiation enhancement techniques employing amplitude and phase masks that can produce high peak irradiance output distributions with small lateral dimensions in the output plane.

It would also be desirable to provide electromagnetic radiation enhancement techniques employing amplitude and phase masks that can be used to adjust the shape of the high peak irradiance distributions in the output plane.

It would also be desirable to provide electromagnetic radiation enhancement techniques employing amplitude and phase masks that can be used to adjust the lateral position of the high peak irradiance distributions in the output plane that do not require traditional scanning mechanisms, and that are simpler to implement and will not introduce additional distortions to the electromagnetic radiation.

It would also be desirable to provide electromagnetic radiation enhancement techniques employing amplitude and phase masks that can produce high radiance distributions with low angular divergence of the electromagnetic radiation.

It would also be desirable to provide electromagnetic radiation enhancement techniques employing amplitude and phase masks that can be used to adjust the angular distribution of the electromagnetic radiation in the far field.

It would also be desirable to provide electromagnetic radiation enhancement techniques employing amplitude and phase masks that can be used to adjust the angular direction of the electromagnetic radiation in the far field of the optical system without mechanical scanning mechanisms.

Furthermore, it would also be desirable to provide optical systems for implementation of the above identified electromagnetic radiation enhancement techniques.

SUMMARY OF THE INVENTION

In view of the foregoing, one object of the present invention is to provide electromagnetic radiation enhancing techniques employing amplitude and/or phase masks that can produce high irradiance distributions in the output plane without a reduction in the Strehl ratio of the resulting field.

It is another object of the present invention to provide electromagnetic radiation enhancing techniques employing amplitude and/or phase masks that can produce high irradiance distributions with small lateral dimensions in the output plane.

It is still another object of the present invention to provide electromagnetic radiation enhancing techniques employing amplitude and/or phase masks that can adjust the shape, position, and irradiance of the distributions in the output plane.

It is still another object of the present invention to provide electromagnetic radiation enhancing techniques employing amplitude and/or phase masks that can adjust the lateral position of the high irradiance distributions, and will not require additional scanning mechanisms for implementation.

It is still another object of the present invention to provide electromagnetic radiation enhancing techniques employing amplitude and/or phase masks that can produce high radiance distributions with low angular divergence.

It is still another object of the present invention to provide electromagnetic radiation enhancing techniques employing amplitude and/or phase masks that can adjust the angular content and radiance of the electromagnetic radiation.

It is still another object of the present invention to provide electromagnetic radiation enhancing techniques employing amplitude and/or phase masks that can adjust the angular divergence, direction, and radiance of the high radiance distributions in the far field.

It is still another object of the present invention to provide electromagnetic radiation enhancing techniques employing amplitude and/or phase masks that can adjust the angular direction of the high output radiance distributions, and will not require additional scanning mechanisms for implementation.

It is still another object of the present invention to provide optical systems for implementation of the above identified electromagnetic radiation enhancement techniques for producing the high irradiance or radiance output field distributions.

The objectives of the present invention are achieved in accordance with the implementation techniques, as well as the respective optical systems for their implementation, as will be further explained in detail in the following embodiments. The objectives of the present invention can be applied to a broad range of electromagnetic radiations, from extreme ultraviolet to long wave infrared and terahertz wavelengths.

The features of the present invention, including the construction and operational details of the preferred embodiments, will now be described in more detail with reference to the accompanying drawings.

BRIEF DESCRIPTION OF THE DRAWINGS

FIGS. 22, 24, 26, 28, and 30 present two-dimensional phase distributions of the first mask located in the input plane of the optical system in accordance with the second embodiment of the present invention.

FIGS. 23, 25, 27, 29, and 31 present two-dimensional irradiance distributions of the electromagnetic radiation in the output plane of the optical system in accordance with the second embodiment of the present invention.

FIG. 32 presents a cross-section of the normalized irradiance distribution of the electromagnetic radiation in the input plane of the optical system in accordance with the third embodiment of the present invention.

FIG. 33 presents a cross-section of the relative irradiance distribution of the electromagnetic radiation in the output plane of the optical system in the presence of only the second mask at the pupil of the system in accordance with the third embodiment of the present invention.

DETAILED DESCRIPTION

Figure 1:
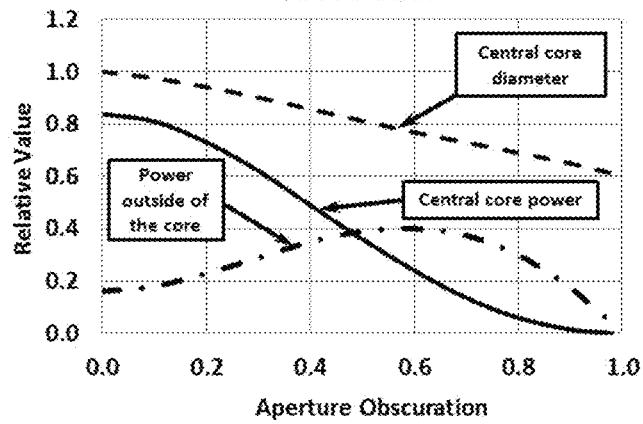
FIG. 1 presents the changes in PSF characteristics for optical systems with central obscurations produced by opaque amplitude masks located at the systems' pupils.
Figure 2:
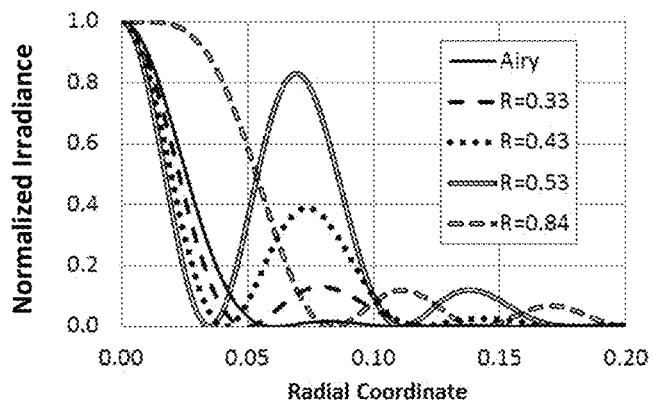
FIG. 2 presents normalized PSF cross-sections for optical systems with phase masks located at the pupils of the systems.
Figure 3:
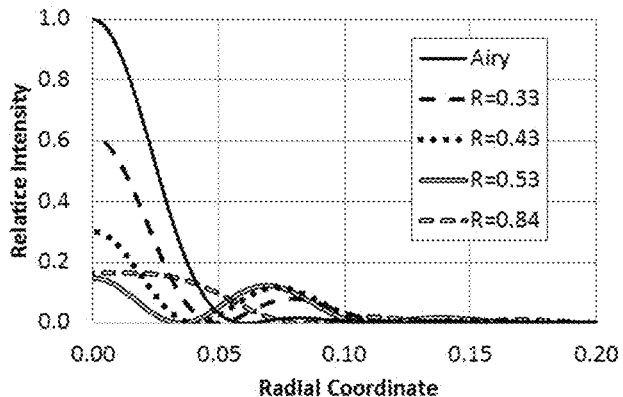
FIG. 3 presents relative PSF cross-sections for optical systems with phase masks located at the pupils of the systems.
Figure 4:
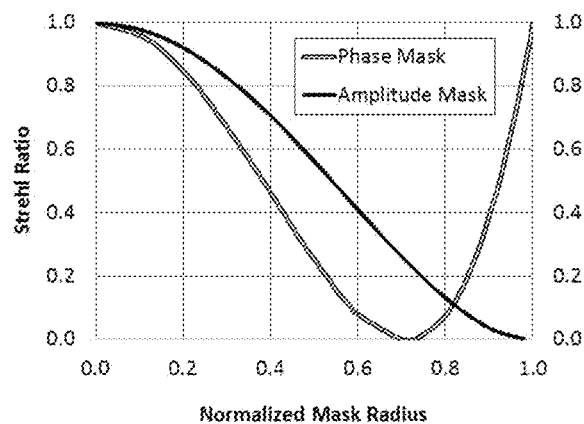
FIG. 4 presents the Strehl ratios of optical systems with amplitude and phase masks as a function of the masks' radial dimensions.

The present invention will be further described in detail in the form of specific embodiments. However, the present invention is not limited to only the specific embodiments described herein, and can be employed in a broad range of photonic instruments in different applications.

The present invention discloses implementation details of techniques for producing localized increase in output irradiance or radiance of electromagnetic radiation employing amplitude and phase masks. While in the following embodiments a wavelength of 0.001 mm is employed to illustrate the operational principals of the different embodiments of the present invention, it will be clear for those skilled in the art of physical optics that this invention can be applied to other regions of the electromagnetic spectra, spanning from extreme ultraviolet to long wave infrared and terahertz radiation.

In accordance with the present invention, high radiances with localized angular content can be produced at significant distances from the optical system, known as the far field, and high output field irradiance distributions can be produced at finite distances from the optical system. The aforementioned electromagnetic radiation enhancements are produced by employing at least two amplitude and/or phase masks located at dissimilar, non-conjugate locations within the optical system. For example, when one of the masks is placed in the focal plane of the optical system, the second mask may be placed at, or in the vicinity of, the system stop location.

The masks may contain localized regions that modify amplitude transmission or reflection of the electromagnetic radiation. The masks may also contain localized regions that modify phase delays of the electromagnetic radiation. The masks may also contain localized regions that modify the amplitude transmission, reflection, and phase delays of the electromagnetic radiation. Multiple localized regions can be contained within the mask at different lateral locations. In some applications, the localized regions contain means to adjust the local transmission or reflection, as well as the local phase delay as a function of time or the lateral position of the mask regions.

The first mask containing localized regions is placed at the input plane of the optical system. The first mask may be comprised of phase regions, amplitude transmissive or reflective regions, or a combination of the phase and amplitude regions. The phase regions produce localized phase delays in the electromagnetic radiation without affecting the local amplitude transmission or reflection. The amplitude regions produce localized attenuation to the electromagnetic radiation without introducing the localized phase delay. A combination of the phase and amplitude regions causes both the localized phase delays and the localized amplitude attenuations of the electromagnetic radiation.

The spatial distribution of the first mask regions, including the localized phase delays and/or the localized amplitude attenuation regions, affects the shape and the attainable irradiance or radiance levels of the output electromagnetic radiation. The highest increase of the output radiation irradiance or radiance with amplitude masks is achieved when the localized radiation following the first mask is zero. Both absorbing and reflective regions may be employed in amplitude masks to obstruct fractions of the electromagnetic radiation and to produce increased intensities in the output observant plane or increased radiance in the far field. The highest increase of the output radiation employing phase mask is achieved when the optical phase delay (OPD) introduced by the first mask phase regions is equal to the product of an odd integer j and half of the wavelength $\lambda/2$ of the radiation, as defined by equation (2). In several applications, the lowest phase delays of OPD=$\lambda/2$, corresponding to j=1, are employed.

The phase delay of the phase mask region and the amplitude transmission of the amplitude mask region can be optionally adjusted to achieve the desired increased levels of the enhanced electromagnetic radiation. The size and shape of the phase and amplitude transmission regions of the first mask are selected to produce the required size and shape of the enhanced radiation in the output plane, or the required angular distribution of the enhanced radiation in the far field. The lateral locations of the first mask regions with respect to the optical axis of the system determine the respective lateral locations of the increased electromagnetic radiation in the output plane or the angular directions of the increased radiance patterns in the far field.

The second mask is placed within the optical system at a non-conjugate location with respect to the location of the first mask. The second mask is comprised of phase regions that introduce phase delay to at least a fraction of the electromagnetic radiation. The localized phase delay and shape of the second mask patterns affect the maximum attainable irradiance or radiance, as well as the background of the electromagnetic radiation at the output of the optical system. The optimum phase delay of the second phase mask regions corresponding to the highest increase of the output radiation depends on the system configuration and location of the first mask. In some configurations, the highest increase of the output radiation is achieved when the phase delay introduced by the second phase mask regions is equal to the product of an odd integer j and half of the wavelength $\lambda/2$, as defined by equation (2). In other configurations, the optimum phase delay of the second phase mask regions required to achieve the highest increase of the output radiation is found through an optimization process, and is different from the values defined by equation (2).

By the appropriate selection of the phase and amplitude regions of the two masks, significant enhancements to the localized strength of the output radiation are achieved, as will be described in detail in the following embodiments of the present invention. The disclosed techniques for enhancing the electromagnetic radiation provide flexibility in adjusting the size, shape, position, and strength of the electromagnetic radiation at the output of the system.

In accordance with the present invention, adjustments in the lateral position, angular direction, and shape of the enhanced output radiation can be performed using electronically controlled spatial light modulators (SLMs). The SLMs may alter the amplitude or the phase of the electromagnetic radiation. Examples of SLMs suitable for controlling the electromagnetic radiation in accordance with the present invention may include, but are not limited to: liquid crystal on silicone (LCOS) SLMs manufactured by Boulder Nonlinear Systems, translucent (liquid crystal display) and reflective (LCOS) SLMs manufactured by HOLOEYE Photonics AG, and Digital Micromirror Devices (DMDs) manufactured by Texas Instruments, Inc.

The localized increase in electromagnetic radiation strength in accordance with the present invention is achieved by redistributing the electromagnetic radiation within the output plane or in the far field, and concentrating the electromagnetic radiation within the localized spatial or angular regions defined by the first mask structure design. The irradiance, shape, and contrast of the enhanced electromagnetic radiation in the output plane, as well as the radiance and divergence of the enhanced electromagnetic radiation in the far field, are defined by the combination of the specific properties of the two masks and their locations within the optical system.

Figure 5A:
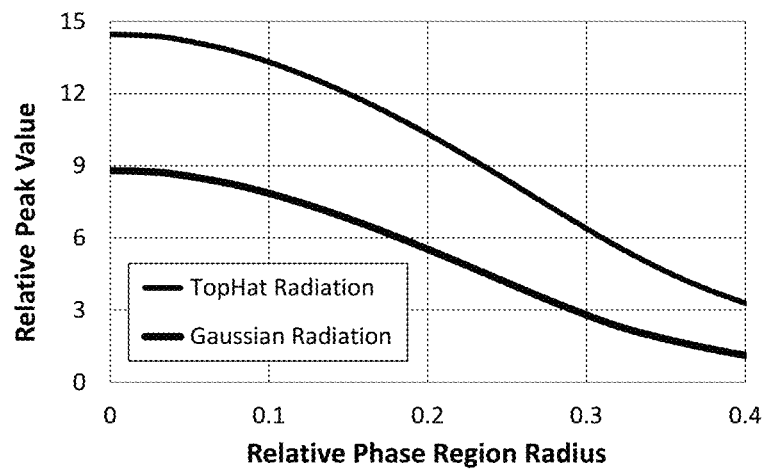
FIGS. 5a and 5b present the relative increase in the peak value of electromagnetic radiation at the output of the optical system as a function of the first mask's feature size and the input radiation shape in accordance with the present invention.

The attainable increase in the strength of the electromagnetic radiation produced at the output of the optical system depends on the relative size of the first mask features with respect to the size of the electromagnetic radiation within the input plane. When the propagating electromagnetic radiation and the first mask regions are circular in shape, the values of the electromagnetic radiation at the output of the optical system depend on the relative radial size of the first mask regions with respect to the radial size of the electromagnetic radiation within the input plane. FIG. 5a presents exemplary relations between the relative localized peak values of the output radiation and the relative size of the first mask circular-shaped phase region in accordance with the present invention. The increase in the relative peak values of the output radiation shown in the figure is achieved with axially symmetric Gaussian-shaped and top-hat-shaped radiation fields within the input plane. The relative values of the localized radiation enhancements presented in the figure are defined as the ratios between the localized peak values of the output radiation in the presence of the masks within the optical system and the respective peak values of the Gaussian-shaped and the top-hat-shaped radiation fields at the system output in the absence of the said masks within the optical system. The relative radii of the first mask phase regions shown in the figure are defined as the ratios of the phase mask radii to the respective values of the Gaussian parameter and the top-hat radius of the radiation at the input plane. FIG. 5a shows that the attainable increase in the peak values of the output radiation decreases with the increase in the relative radius of the first phase mask regions.

Figure 5B:
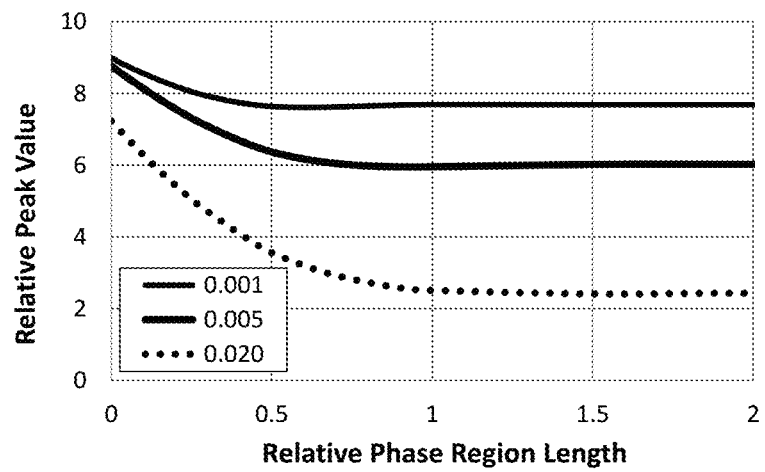

When the first mask regions are rectangular in shape, the attainable increase in the radiation strength at the output of the optical system depends on the aspect ratio and the linear size of the first mask regions with respect to the size of the electromagnetic radiation within the input plane. FIG. 5b presents exemplary relations between the relative peak values of the output radiation and the relative length of the first mask rectangular phase regions for three relative width values of 0.001, 0.005, and 0.02, in accordance with the present invention. The increase in the localized peak values of the output radiation shown in the figure is achieved with axially symmetric Gaussian-shaped and top-hat-shaped radiation fields within the input plane. The relative peak values of the localized radiation are defined as the ratios of the localized peak values of the output radiation in the presence of the masks within the optical system to the respective peak values of the Gaussian-shaped and the top-hat-shaped radiation at the system output in the absence of the said masks within the optical system. The relative lengths of the first phase mask regions shown in FIG. 5b are defined as the ratios of the phase mask lengths values to the respective values of the Gaussian parameter and the top-hat radius of the radiation at the input plane. The attainable increase in the peak values of the output radiation, as shown in FIG. 5b, decreases with the increase in the relative width and length of the rectangular-shaped first mask phase regions.

The attainable increase in the output radiation peak values also depends on the relative lateral position of the first mask regions with respect to the optical axis of the system and the centroid of the radiation in the input plane.

Figure 6A:
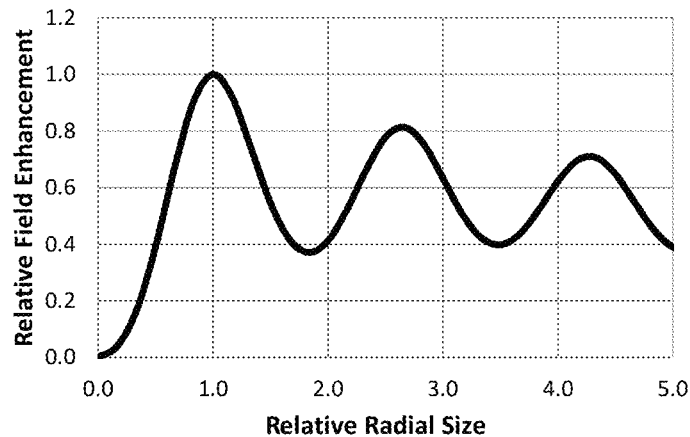
FIGS. 6a, 6b, and 6c present the relative changes in the enhanced electromagnetic radiation irradiance or radiance at the output of the optical system for different input field distributions as a function of the second phase mask region radial size in accordance with the present invention.
Figure 6B:
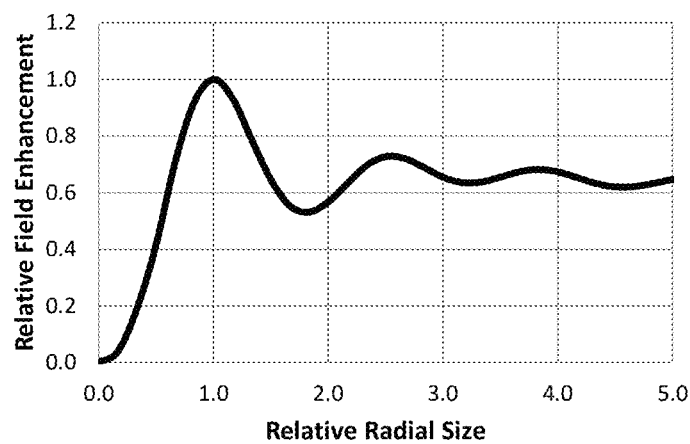
Figure 6C:
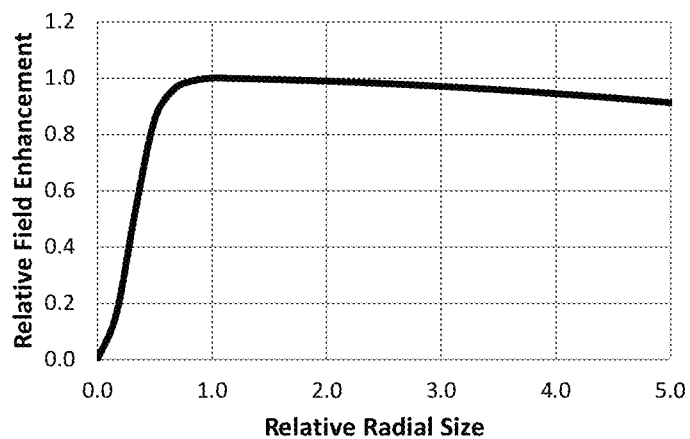

The electromagnetic radiation strength increase produced at the output of the optical system also depends on the relative size of the second phase mask regions, as well as the shape of the propagating electromagnetic radiation within the input plane of the optical system. FIGS. 6a through 6c present the relative enhancements of the output electromagnetic radiation as a function of the relative radial size of the second phase mask regions for three different propagating beam shapes. The relative radial size of the second phase mask regions shown in FIGS. 6a through 6c is normalized to the radial phase mask value corresponding to the maximum output field enhancement. FIG. 6a presents the relative output radiation strength enhancement as a function of the relative radial size of the second phase mask region for top-hat shaped propagating electromagnetic radiation. FIG. 6b presents the relative output electromagnetic radiation strength enhancements as a function of the relative radial size of the second phase mask zone for apodized top-hat shaped propagating electromagnetic radiation. Apodization leads to a reduction in the magnitude of the oscillations of the enhanced output field. FIG. 6c presents the relative output electromagnetic radiation strength enhancements as a function of the relative radial size of the second phase mask zone for a Gaussian-shaped propagating electromagnetic radiation. The figure shows that the Gaussian-shaped radiation does not produce oscillations of the enhanced output field as a function of the relative radial size of the second phase mask zone.

In accordance with the present invention, the enhanced output electromagnetic radiation may be localized in one or more regions within the output plane or in the far field of the optical system. The localized regions of the enhanced strength radiation may take different shapes and patterns, and are defined by the respective shapes of the first mask regions producing phase delays or amplitude modifications to the propagating radiation.

Adjustments in the lateral position or angular orientation of the locally enhanced output radiation in accordance with the present invention are achieved by respective adjustments in the lateral position of the localized first mask regions in the input plane. This provides control of the locally enhanced output radiation that does not require traditional scanning mechanisms such as the scanners that employ two independently controlled galvanometric mirrors in combination with an f-theta lens.

Further details of the proposed methods for producing localized enhancements of the electromagnetic radiation strength, as well as the optical systems for their implementation, will be explained in detail in the following embodiments.

First Embodiment

The first embodiment of the present invention is designed to produce localized regions with increased radiance at the output of an optical system. In accordance with the first embodiment, the electromagnetic radiance enhancements are produced at significant distances from the optical system often referred to in literature as the far field. The far field condition for electromagnetic radiation with lateral dimensions d and wavelength λ is achieved when the output plane is located at the far field distance $L_{FF}$ from an optical system that satisfies the following inequality:

$$L_{FF} \gg \frac{d^2}{\lambda} \qquad (3)$$

For example, the far field condition for an optical system with the aperture diameter d=20 mm and the wavelength of the electromagnetic radiation λ=0.001 mm is satisfied at distances $L_{FF}$>>400 m.

Figure 7:
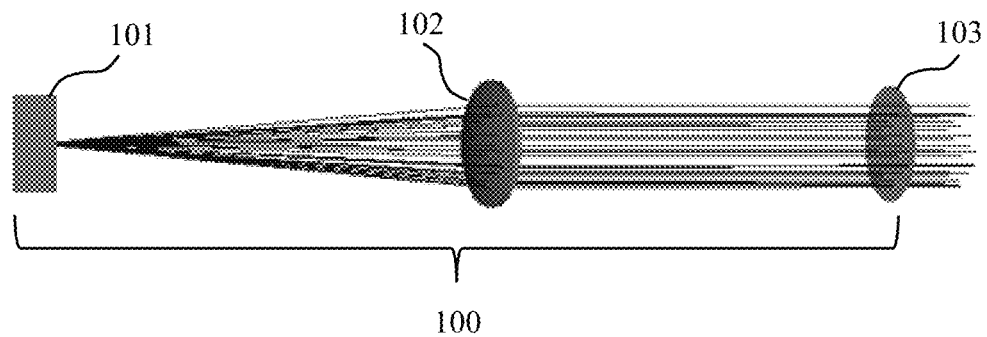
FIG. 7 presents an optical layout of an optical system for producing high radiance far field distributions in accordance with the first embodiment of the present invention.

The layout of an optical system for producing increased output radiance in accordance with the first embodiment of the present invention is shown in FIG. 7. The system 100 contains a first mask 101 located in the input plane of the system, a lens 102 located approximately at a focal distance from the input plane, and a second mask 103 located after the lens 102.

A detailed prescription of the optical system 100 in accordance with the first embodiment of the present invention is shown in the following Tables 1 and 2.

TABLE 1

Optical prescription of the first embodiment

| Element | Vertex Radius of Curvature (mm) | Thickness (mm) | Glass |
| --- | --- | --- | --- |
| Object (Mask 101) | INFINITY | 100.300 | — |
| Surface 1 (Lens 102) | 41.249 | 3.000 | BK7 |
| Surface 2 (Lens 102) | 220.000 | 90.000 | — |
| Pupil (Mask 103) | INFINITY | — | — |

TABLE 2

Aspheric coefficients of the first embodiment

| Element | K | A1 | A2 |
| --- | --- | --- | --- |
| Object (Mask 101) | 0.000 | 0.000 | 0.000 |
| Surface 1 (Lens 102) | −1.782 | 0.000 | 0.000 |
| Surface 2 (Lens 102) | 0.000 | 0.000 | 0.000 |
| Pupil (Mask 103) | 0.000 | 0.000 | 0.000 |

The back focal plane of the optical system 100 is located 99.929 mm from the first surface of the lens 102. The first mask 101 is displaced by 0.371 mm from the back focal plane of the lens 102. In alternative designs, the first mask locations may be different. For example, the first mask may be located at the back focal plane of the lens 102, or displaced from the back focal plane at different distances.

The second mask 103 is located 90.0 mm away from the second surface of the lens 102. In alternative designs, the locations of the second mask with respect to the lens 102 may also differ, and the associated optical system's geometry, including the location of the input plane with the first mask 101 with respect to the first surface of the lens 102 needs to be re-optimized accordingly to produce the required output electromagnetic radiation radiances and background levels in the far field.

Figure 8:
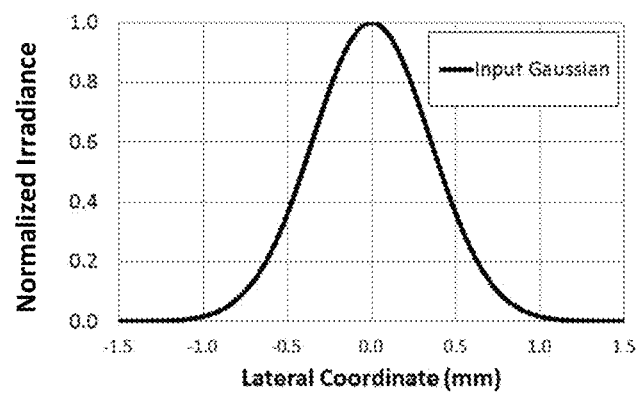
FIG. 8 presents a cross-section of the normalized irradiance distribution of the electromagnetic radiation in the input plane of the optical system in accordance with the first embodiment of the present invention.

The electromagnetic radiation in the input plane of the optical system 100 has a Gaussian circularly-symmetric shape. The Gaussian beam waist parameter value is 0.7 mm. An irradiance cross-section of the input Gaussian-shaped radiation is shown in FIG. 8. The input electromagnetic radiation propagates through the first mask 101 located at the input plane of the optical system 100. The input electromagnetic radiation is modified by the first mask 101, and is directed onto the lens 102. After passing through the lens 102, the electromagnetic radiation is further directed onto the second mask 103. The second mask 103 produces a localized phase modification of the electromagnetic radiation. Localized modifications of the electromagnetic radiation produced by the first mask 101 and the second mask 103 lead to the localized strength enhancements of the electromagnetic radiation at the output of the optical system.

Figure 9:
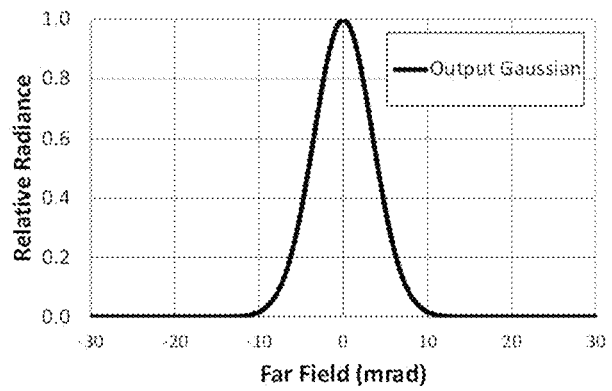
FIG. 9 presents a cross-section of the normalized radiance at the output of the optical system when no masks are present within the system in accordance with the first embodiment of the present invention.

When the two masks 101 and 103 are absent from the optical system 100, the radiance of the output radiation preserves its Gaussian profile, as shown in FIG. 9.

The first phase mask 101 has a single radially-symmetric phase region, with a region radial size of 0.001 mm. The phase region of the mask 101 is aligned in the input plane with the optical axis of the system 100. The phase delay introduced by the central region of the mask 101 is 0.5π, corresponding to the OPD between the fraction of the radiation propagating through the central region and the rest of the field of 0.5λ. When the phase structure is fabricated as an etched cavity or a relief pattern onto the transmissive mask substrate, the height of the phase mask steps h is calculated as:

$$h = \frac{OPD}{(n-1)} \qquad (4)$$

where n is the refractive index of the phase mask material. For a phase mask 103 made of BK7 glass with a refractive index n=1.5075 at a wavelength of λ=0.001 mm, the step height h of the phase mask structure corresponding to OPD=0.5λ will be 0.9852 microns.

Figure 10:
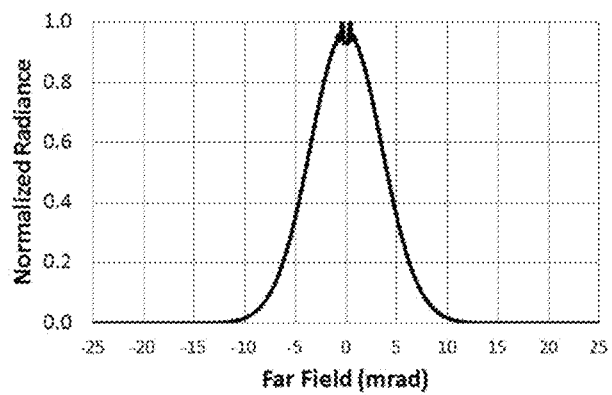
FIG. 10 presents a cross-section of the normalized radiance at the output of the optical system in the presence of only the first mask in the input plane in accordance with the first embodiment of the present invention.

When only the first mask 101 is present at the input plane of the optical system 100, the output field radiance is shown in FIG. 10 and resembles the output radiance shown in FIG. 9.

Figure 11:
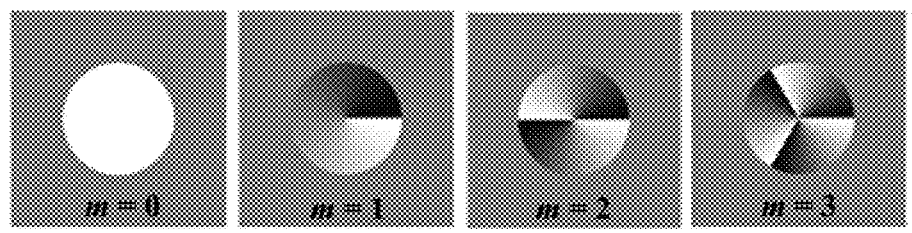
FIG. 11 presents phase distributions of vortex phase structures with topological charge values of 0, 1, 2, and 3.

The second phase mask 103 contains phase regions termed in literature as vortex phase structures. The electromagnetic field distribution produced by a vortex phase depends on the radial coordinate ρ and the azimuthal angle φ, and is defined by the following equation:

$$E(x, y, \rho, \varphi) = \begin{cases} E(x, y)e^{im\varphi}, & \text{when } \rho \leq R_{max} \\ 0, & \text{when } \rho > R_{max} \end{cases} \qquad (5)$$

where E(x, y) is the field amplitude defined in Cartesian coordinates, m is the topological charge of the vortex phase structure, and $R_{max}$ is the maximum radial coordinate. The topological charge m defines the number of 2 π phase transitions over the azimuthal angle φ changing from 0° to 360° FIG. 11 shows the phase distributions of vortex phase structures with the topological charge numbers m equaling to 0, 1, 2, and 3. The topological charge m=0 corresponds to the trivial case of a uniform phase mask with zero OPD. The phase distributions corresponding to the topological charges of m=1, m=2, and m=3 show the respective number of 2π phase transitions equaling to 1, 2, and 3, respectively.

Figure 12:
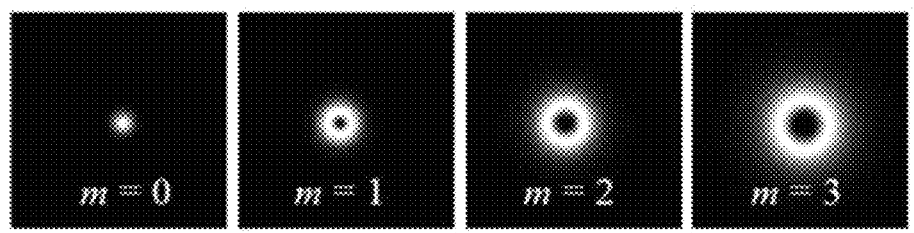
FIG. 12 shows radiance distributions of vortex phase structures with topological charge values of 0, 1, 2, and 3.

When only the second mask 103 is present within the optical system 100, the output radiance is no longer Gaussian-shaped. FIG. 12 shows the radiance distributions of vortex phase structures with topological charge numbers m of 0, 1, 2, and 3. The topological charge m=0 corresponds to the Gaussian-shaped output distribution shown in FIG. 9.

Figure 13:
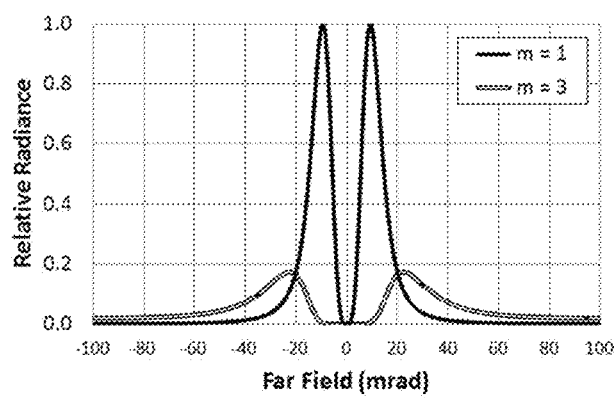
FIG. 13 presents a comparison of the output radiance cross-sections produced by an optical system that employs second masks containing vortex phase structures with topological charge values of 1 and 3 in accordance with the first embodiment of the present invention.

The output radiance distributions corresponding to the topological charges of m=1, m=2, and m=3 are doughnut-shaped, with the doughnut size progressively increasing with the rise in the topological charge m. FIG. 13 presents the relative cross-sections of radiance distributions in the presence of the second mask 103 containing vortex phase structures with the topological charge numbers m equaling 1 and 3. The figure shows that an increase in the topological charge leads to an increase in the doughnut-shaped pattern size, as well as a reduction in the peak radiance of the pattern.

Figure 14:
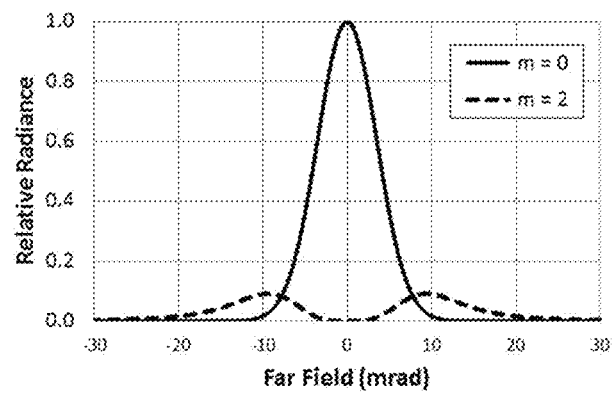
FIG. 14 presents a comparison of the output radiance cross-sections produced by an optical system that employs second masks containing vortex phase structures with topological charge values of 0 and 2 in accordance with the first embodiment of the present invention.

FIG. 14 compares the cross-sections of the output radiance distributions produced by the optical system that employs second masks with vortex phase structures. The solid curve corresponds to the topological charge m=0 and presents a cross-section of the Gaussian-shaped output field similar to that shown in FIG. 9. The dashed curve in FIG. 14 shows the cross-section of the output radiance distribution from the optical system that employs a second mask with a topological charge value of m=2. FIG. 14 indicates that vortex phase structures can be employed to significantly reduce the output peak radiance, as compared to the Gaussian-shaped output field for m=0.

Figure 15:
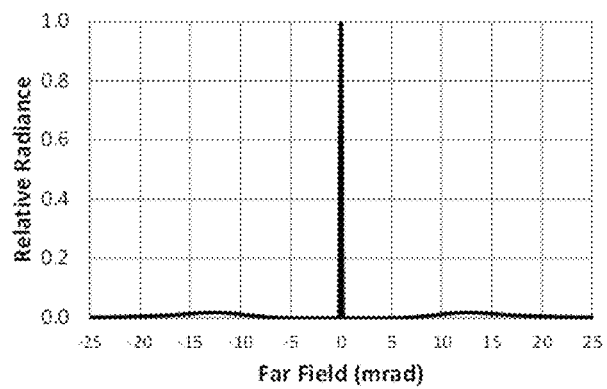
FIG. 15 presents the enhanced output radiance cross-section produced by employing the second vortex phase mask with a topological charge number of 4 in accordance with the first embodiment of the present invention.

The employment of both the first mask 101 and the second mask 103 within the optical system 100 produces a localized enhancement of the output field in the output plane. FIG. 15 presents the radiance cross-section of the enhanced field in the output plane produced by employing a second phase mask 103 that incorporates a vortex phase structure with topological charge m=4. FIG. 15 also shows low levels of background radiation, especially in the vicinity of the enhanced radiance peak, achieved through the employment of the vortex phase structures as part of the second mask design.

Second Embodiment

Figure 16:
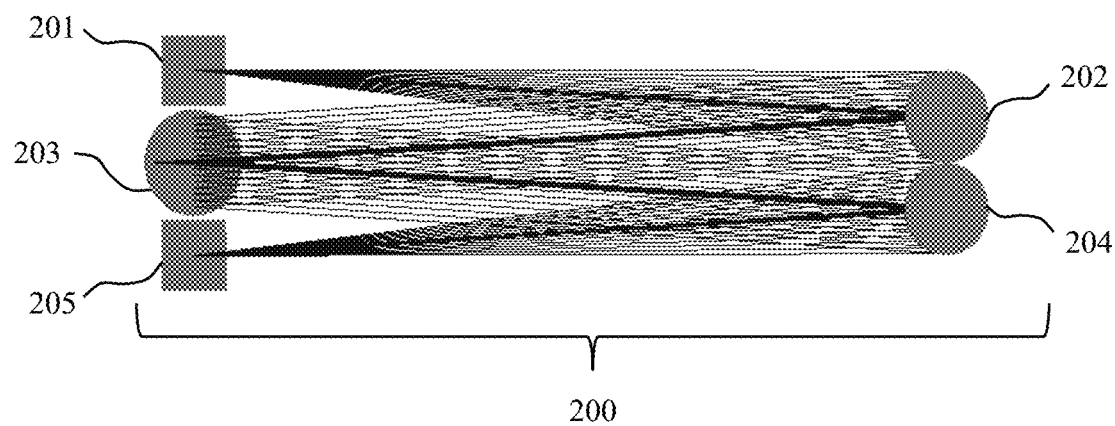
FIG. 16 presents an optical layout of a reflective system for producing high irradiance distributions in the output plane in accordance with the second embodiment of the present invention.

The second embodiment of the present invention discloses the electromagnetic radiation localized irradiance enhancement technique produced by employing a three-mirror catoptric optical system 200. The layout of the system 200 is shown in FIG. 16. Catoptric systems can be implemented in applications employing radiation in spectral regions where transmissive optical materials are not available, such as, but not limited to, extreme ultraviolet optical lithography or terahertz spectroscopy.

The optical system 200 contains a first reflective mask 201 located in the input plane, a first mirror 202 located in the optical path after the first mask 201, a second reflective phase mask 203 located in the optical path after the first mirror 202, a second mirror 204 located in the optical path after the second reflective phase mask 203, and the output plane 205 where the enhancement of the electromagnetic radiation is observed and located in the optical path after the second mirror 204.

The optical system 200 in accordance with the second embodiment of the present invention has a magnification M=−1. The detailed prescription of the optical system 200 is provided in the following Tables 3 and 4:

TABLE 3

Optical prescription for the second embodiment

| Element | Vertex Radius of Curvature (mm) | Thickness (mm) | Glass |
|---|---|---|---|
| Object (Mask 201) | INFINITY | 100.000 | — |
| Surface 1 (Mirror 202) | −200 | −100.000 | MIRROR |
| Stop (Mask 203) | INFINITY | 100.000 | MIRROR |

TABLE 3-continued

Optical prescription for the second embodiment

| Element | Vertex Radius of Curvature (mm) | Thickness (mm) | Glass |
|---|---|---|---|
| Surface 3 (Mirror 204) | −200 | −100.011 | MIRROR |
| Output plane 205 | INFINITY | — | — |

TABLE 4

Coordinate transformations for the second embodiment

| Element | Decenter X (mm) | Decenter Y (mm) | Tilt X (deg.) | Tilt Y (deg.) |
|---|---|---|---|---|
| Object (Mask 201) | 0.0 | 0.0 | 0.0 | 0.0 |
| Surface 1 (Mirror 202) | 0.0 | 0.0 | 1.5 | 0.0 |
| Stop (Mask 203) | 0.0 | 2.6 | 0.0 | 0.0 |
| Surface 3 (Mirror 204) | 0.0 | 2.6 | 0.0 | 0.0 |
| Output plane 205 | 0.0 | 2.6 | 0.0 | 0.0 |

Figure 17:
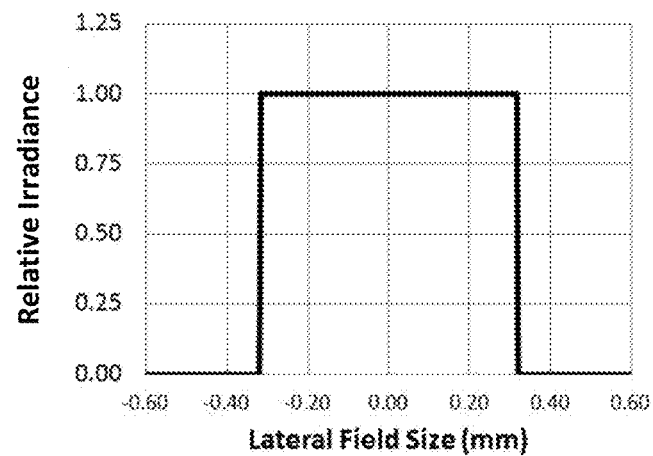
FIG. 17 presents a cross-section of the normalized irradiance distribution of the electromagnetic radiation in the input plane of the optical system in accordance with the second embodiment of the present invention.

The input electromagnetic radiation in accordance with the second embodiment of the present invention is an axially-symmetric top-hat-shaped irradiance distribution. The electromagnetic radiation radius is 0.320 mm and the wavelength of the electromagnetic radiation is $\lambda=1$ micron. FIG. 17 shows a normalized irradiance cross-section of the electromagnetic radiation at the input plane of the optical system 200.

The first mask 201 in accordance with the second embodiment of the present invention is centered with respect to the electromagnetic radiation and contains a square-shaped reflective phase structure with the lateral dimensions 0.01 mm×0.01 mm located in the center of the mask. The phase delay introduced by the square-shaped reflective phase structure of the first mask 201 to the electromagnetic radiation is $0.50\pi$, and corresponds to an optical path difference OPD=$0.50\lambda$ between the fraction of the radiation reflected from the mask reflective phase structure and from the rest of the electromagnetic radiation.

In the case of reflective phase masks, the radiation passes twice by the phase structure. Therefore, the height of the phase mask step h fabricated onto a reflective phase mask is calculated as:

$$h = \frac{OPD}{2n_{air}\cos(\theta)} \quad (6)$$

where $n_{air}$ is the refractive index of the air surrounding the phase mask, and $\theta$ is the incidence angle of the electromagnetic radiation onto the reflective mask.

For small angles of incidence $\theta$ of the electromagnetic radiation with wavelength $\lambda=1$ micron onto the phase mask surface, the step height h of the phase mask structure in accordance with equation (6) is approximately 0.25 microns.

While a single square-shaped reflective phase structure is employed as part of the first mask 201 in accordance with the second embodiment of the present invention, multiple phase patterns with alternative geometries can also be employed to shape the enhanced electromagnetic radiation in the output plane. The alternative phase structure patterns can include circles, polygons, and spline-based closed curves, as well as their combinations.

The electromagnetic radiation reflects from the first mask 201 located at the input plane, and is directed onto the first concave mirror 202 located at the focal distance from the input plane. The input plane of the optical system 200 containing the first phase mask 201 is located in the front focal plane of the first mirror 202. After reflection from the first concave mirror 202, the electromagnetic radiation is further directed onto the second reflective phase mask 203 located at the pupil of the optical system 200. The pupil of the optical system 200 containing the second phase mask 203 is located in the back focal plane of the first mirror 202.

The second reflective mask 203 contains a circular central phase zone centered with respect to the axis of the optical system 200. The maximum electromagnetic radiation enhancement in the output plane is achieved when the second phase mask 203 central zone radial size is equal to 0.191 mm.

The phase delay introduced by the reflective phase zone of the second mask 203 with respect to the electromagnetic radiation is also $0.50\pi$, corresponding to the optical path difference OPD=$0.50\lambda$ between the fraction of the radiation reflected from the phase mask zone and from the rest of the mask 203. The step height of the second phase mask structure corresponding to the optical path difference OPD=$0.50\lambda$ in accordance with equation (6) and small angles of incidence $\theta$ of the electromagnetic radiation is also approximately 0.25 microns. The optical path difference introduced by the phase masks 201 and 203 can also be equal to a multiple of an odd integer j times half the wavelength $\lambda/2$ of the electromagnetic radiation, as defined earlier by equation (2).

After reflection from the second phase mask 203, the electromagnetic radiation is further directed onto the second concave mirror 204. The second reflective mask 203 is also located in the front focal plane of the second mirror 204. The electromagnetic radiation is reflected from the second concave mirror 204, and is directed onto the output plane 205 of the system 200, where the electromagnetic radiation enhancements are observed. The output plane 205 is located in the vicinity of the back focal plane of the second concave mirror 204.

Figure 18:
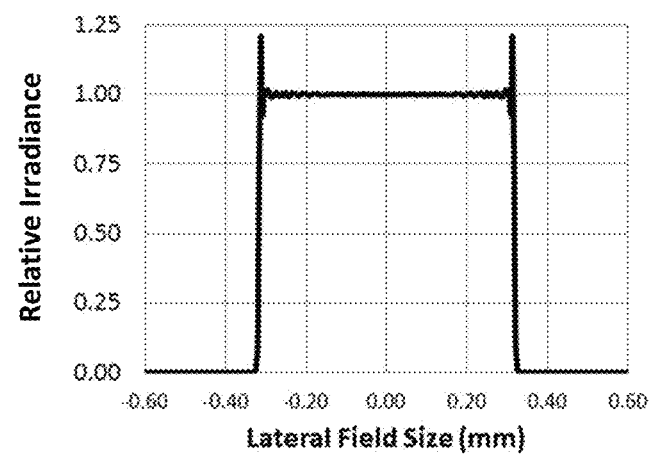
FIG. 18 presents a cross-section of the relative irradiance distribution of the electromagnetic radiation in the output plane of the optical system when the first and the second masks are absent from the system.

FIG. 18 shows the normalized irradiance cross-section of the axially-symmetric field distribution of the electromagnetic radiation in the output plane 205, when the two masks 201 and 203 are absent from the optical system 200. The figure shows the presence of diffraction fringes at the outer margins of the electromagnetic radiation irradiance cross section in the output plane 205.

Figure 19:
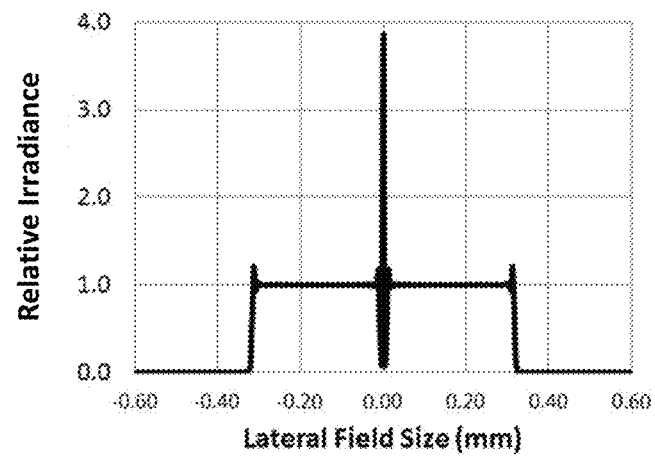
FIG. 19 presents the relative irradiance cross-section of the field distribution produced at the output plane of the optical system when only the first reflective phase mask is contained within the optical system at the input plane.

When only the first reflective phase mask 201 is added to the optical system 200, on-axis enhancement of the electromagnetic radiation is produced in the output plane 205. FIG. 19 presents the irradiance cross-section of the axially-symmetric field distribution produced at the output plane 205 of the optical system 200 in the presence of only the first reflective phase mask 201. The observed on-axis relative electromagnetic radiation enhancement is 3.86 times the value when the first mask 201 is not present in the system.

Figure 20:
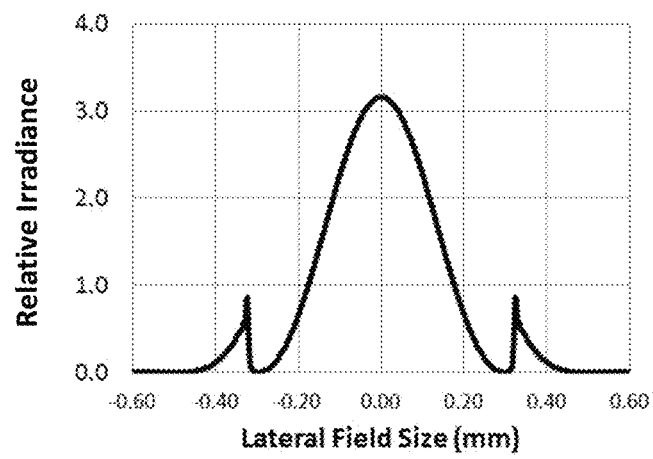
FIG. 20 presents the relative irradiance cross-section of the electromagnetic radiation in the output plane when only the second reflective phase mask is contained within the optical system and placed at the stop location.

FIG. 20 presents the shape of the electromagnetic radiation in the output plane 205 of the optical system 200, when only the second reflective phase mask 203 is contained within the optical system and placed at the system stop. The peak irradiance of the field distribution in the output plane 205 shown in FIG. 20 exceeds the on-axis irradiance of the electromagnetic radiation shown in FIG. 18 by 3.16 times.

Figure 21:
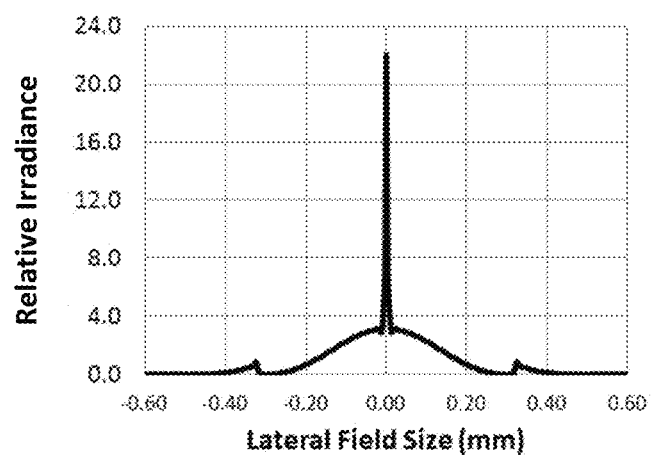
FIG. 21 presents the relative irradiance cross-section of the electromagnetic radiation in the output plane of the optical system in the presence of both the first and the second masks within the system in accordance with the second embodiment of the present invention.
Figure 22:
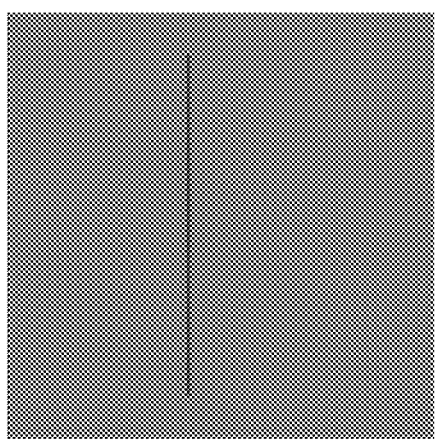

Significant strength enhancements of the electromagnetic radiation in the output plane 205 of the optical system 200 are achieved when both the first 201 and the second 203 reflective phase masks are present in the optical system, as shown in the optical layout in FIG. 17. The irradiance cross section of the electromagnetic radiation in the output plane 205 of the optical system 200 containing the two masks 201 and 203 is shown in FIG. 21. The enhanced on-axis peak irradiance value in the output plane 205 in the presence of the masks 201 and 203 exceeds the respective on-axis output irradiance values without the two masks within the system by about 22.0 times.

Figure 23:
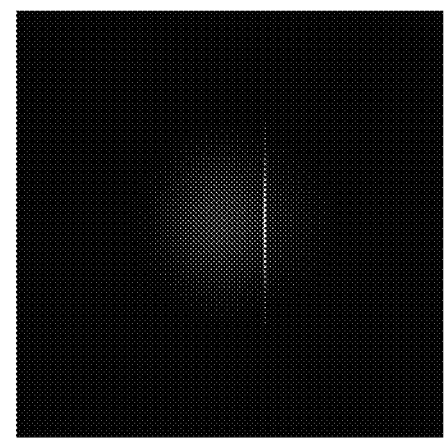
Figure 24:
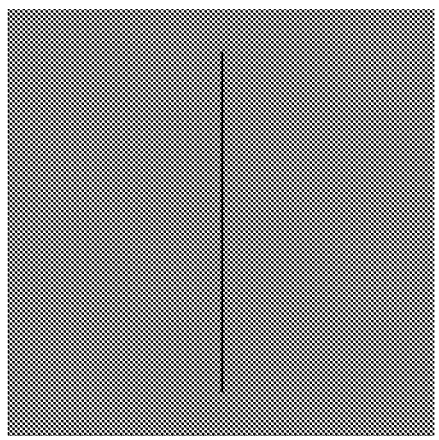
Figure 25:
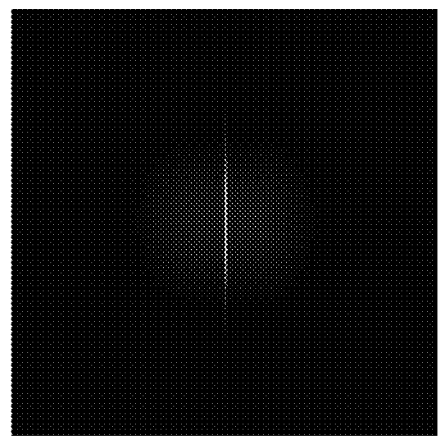
Figure 26:
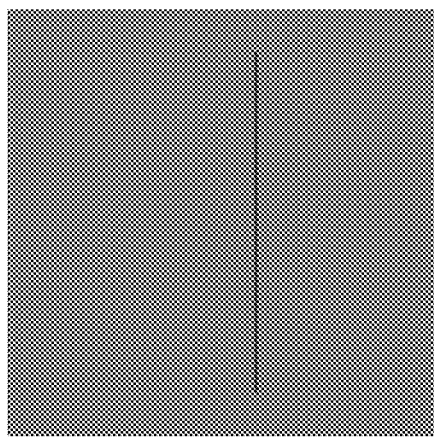
Figure 27:
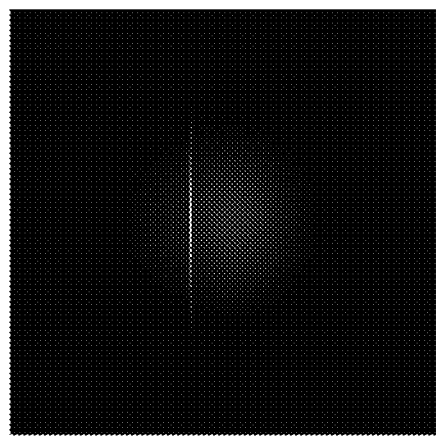
Figure 28:
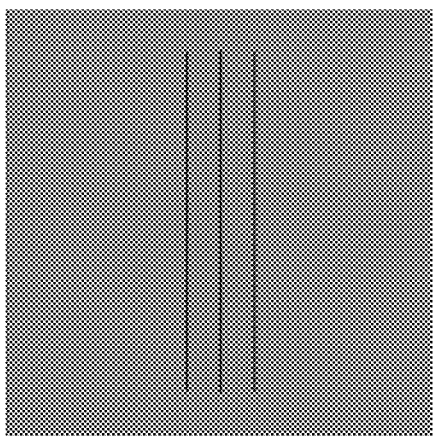
Figure 29:
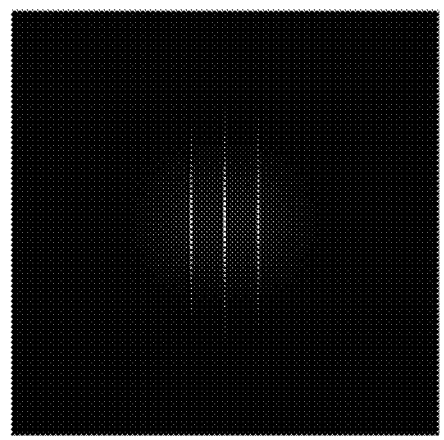

FIGS. 22 through 31 show the formation of different enhanced output distribution patterns at the output plane 205 of the optical system 200. FIGS. 23, 25, 27, 29, and 31 show the enhanced irradiance distributions produced in the output plane 205 of the optical system 200, resulting from the respective first phase mask patterns shown in FIGS. 22, 24, 26, 28, and 30, while the second reflective phase mask 203 is unchanged. The optical path difference of the first phase mask steps shown in FIGS. 22, 24, 26, 28, and 30 with respect to the mask substrate is $0.50\lambda$. FIGS. 23, 25, and 27 present the formation of single elongated high aspect ratio radiation enhancement patterns in the output plane. The lateral location of the enhanced elongated patterns in the output plane 205 shown in FIGS. 23, 25, and 27 depends on the lateral position of the respective phase patterns of the first mask 201 within the input plane shown in the respective FIGS. 22, 24, and 26. FIGS. 29 and 31 present the formation of multiple elongated radiation patterns in the output plane 205 based on the respective shapes of the of the corresponding elongated phase patterns of the first mask 201 located within the input plane of the optical system 200 shown in FIGS. 28 and 30.

Third Embodiment

The third embodiment of the present invention presents localized irradiance enhancements of the electromagnetic radiation that produce high contrast field distributions in the output plane of an optical system. The field contrast is defined as a ratio of the enhanced irradiance peak to the neighboring field background in the output plane. The third embodiment is based on the optical system layout shown in FIG. 16 which was described in detail in the second embodiment. In the following description of the third embodiment, the notation of the second embodiment will be used to refer to the components of the optical system 200. FIG. 32 shows the normalized irradiance cross-section of an axially-symmetric Gaussian-shaped electromagnetic radiation at the input plane of the optical system 200. The input Gaussian field has a beam parameter radius of 0.530 mm and a wavelength of $\lambda=1$ micron. When the two masks 201 and 203 are absent from the optical system, the electromagnetic radiation in the output plane 205 matches the shape of the input field shown in FIG. 32.

The introduction of only the reflective phase mask 203 at the stop location of the optical system 200 alters the shape of the electromagnetic radiation in the output plane 205. The phase mask 203 has a square-shaped central zone with a lateral size of 0.090 mm and a step height of 0.25 microns. The square-shaped lateral size of the mask 203 central zone is selected to reduce the on axis irradiance of the electromagnetic radiation in the output plane 205, and is shown in FIG. 33.

Enhancements of the output field distribution in the output plane 205 of the optical system 200 are achieved when both the first 201 and second 203 masks are contained within the optical system 200. The first mask 201 has a square-shaped reflective phase region with a lateral size of 0.005 mm. The phase delay introduced by the reflective phase region of the mask 201 to the electromagnetic radiation is $0.50\pi$, corresponding to the optical path difference of 0.50λ introduced by the phase mask region to the electromagnetic radiation. The step height of the phase mask region in accordance with equation (6) for the small angles of incidence θ is approximately 0.25 microns.

Figure 34:
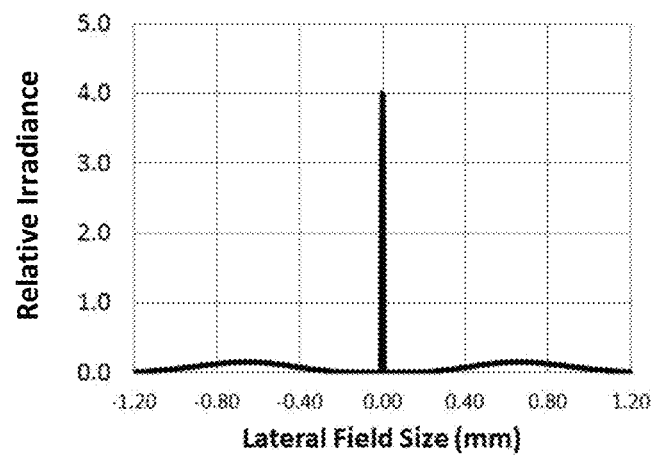
FIG. 34 presents a cross-section of the relative irradiance distribution of the enhanced electromagnetic radiation in the output plane of the optical system in the presence of both the first and the second masks within the system in accordance with the third embodiment of the present invention.

FIG. 34 presents the relative cross-section of the enhanced irradiance in the output plane 205 of the optical system 200 achieved when both the first 201 and the second 203 masks are present in the system. As can be seen from FIG. 34, the radiation background in the vicinity of the on-axis irradiance peak is practically negligible. The low levels of the radiation background in the vicinity of the radiation peak are achieved through the selection of the lateral size of the square-shaped central region of the phase mask 203.

Fourth Embodiment

The fourth embodiment of the present invention presents localized irradiance enhancements of the electromagnetic radiation that produce high contrast field distributions in the output plane of an optical system. The fourth embodiment also employs the optical system 200 described in detail in the second embodiment of the present invention and shown in FIG. 16. Therefore, in the following description of the fourth embodiment, the notation of the second embodiment will be used to refer to the components of the optical system 200.

In accordance with the fourth embodiment of the present invention, the optical system 200 contains means for the independent adjustment of the lateral position of the first mask 201 within the input plane. The lateral adjustments can be achieved employing, for example, a motion stage with orthogonal motion axes. The first mask 201 can be attached to the motion stage to adjust the lateral position of the mask. Alternatively, the motion stage may be attached to the optical system 200 to adjust the lateral position with respect to the incoming electromagnetic radiation.

Figure 35:
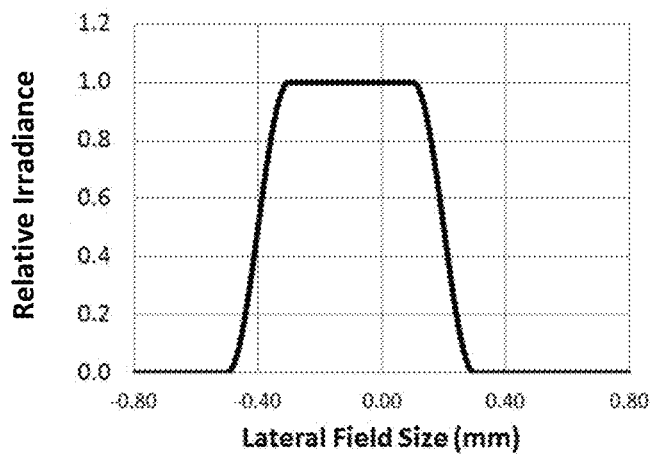
FIG. 35 presents a cross-section of the normalized irradiance distribution of the electromagnetic radiation in the input plane of the optical system in accordance with the fourth embodiment of the present invention.

The fourth embodiment of the present invention presents the irradiance enhancement of a propagating top-hat-apodized electromagnetic radiation. FIG. 35 shows the normalized irradiance cross-section of the axially-symmetric top-hat-apodized electromagnetic radiation at the input plane of the optical system 200. The radial width of the apodized field in the input plane is 0.4 mm, the apodized irradiance transition zone width is 0.2 mm, and the wavelength of the electromagnetic radiation is λ=1 micron. The centroid of the apodized field in the input plane of the optical system 200 is laterally shifted by 0.1 mm with respect to the optical axis of the system.

Figure 36:
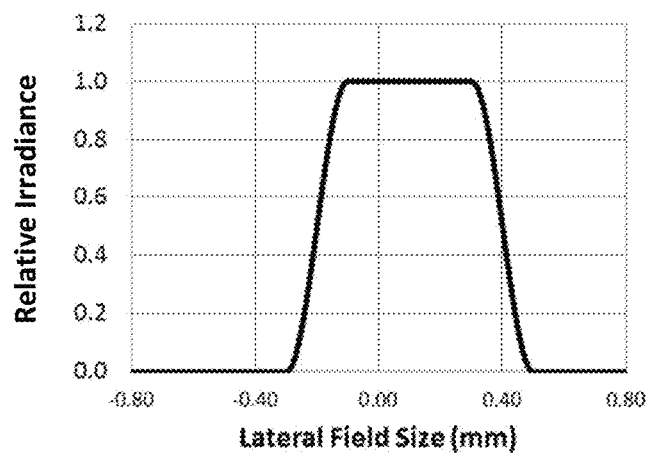
FIG. 36 presents a cross-section of the relative irradiance distribution of the electromagnetic radiation in the output plane of the optical system in the absence of the first and the second masks within the system.

FIG. 36 shows the cross-section of the relative irradiance of the electromagnetic radiation in the output plane 205, when no masks are present within the optical system 200. The centroid of the electromagnetic radiation in the output plane 205 is laterally shifted by 0.1 mm from the optical axis in the direction opposite to the lateral shift of the radiation in the input plane.

Figure 37:
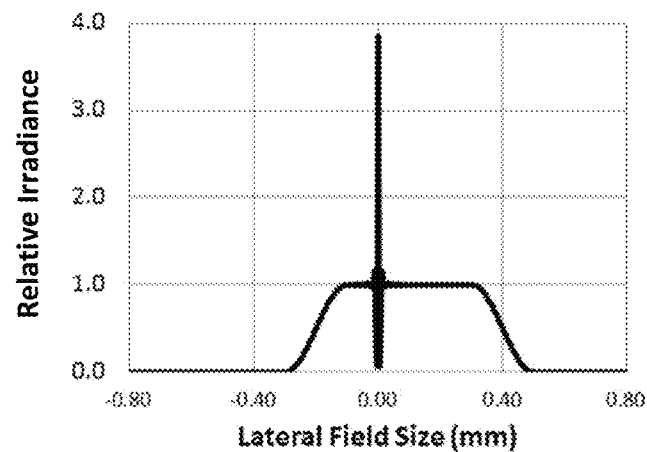
FIG. 37 presents a cross-section of the relative irradiance distribution of the electromagnetic radiation in the output plane of the optical system in the presence of only the first mask in the input plane.

FIG. 37 presents the cross-section of the radiation irradiance at the output plane of the optical system 200 when only the first phase mask 201 is included at the input plane. The phase mask 201 has an axially-symmetric central region with a radial size of 0.005 mm. The phase delay introduced by the phase region of the mask 201 to the electromagnetic radiation is 0.50π, corresponding to the optical path difference of 0.50λ. The step height of a reflective phase mask structure in accordance with equation (6) for the small angles of incidence θ is approximately 0.25 microns. FIG. 37 shows the relative 3.8 times increase in the peak irradiance produced by the addition of the first mask 201.

Figure 38:
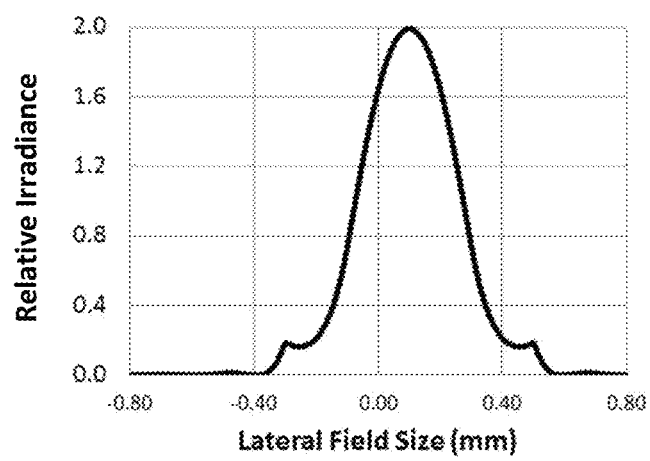
FIG. 38 presents a cross-section of the relative irradiance distribution of the electromagnetic radiation in the output plane of the optical system in the presence of only the second mask at the pupil of the system.

FIG. 38 presents the cross-section of the field irradiance at the output plane of the optical system 200 when only the second phase mask 203 is included at the stop of the optical system 200. The reflective phase mask 203 contains an axially-symmetric central region with a radial size of 0.185 mm. The phase delay introduced by the phase region of the mask 203 to the electromagnetic radiation is 0.50π, corresponding to the optical path difference of 0.50λ and the step height of 0.25 microns. FIG. 38 shows the relative 1.99 times increase in the peak irradiance produced by the addition of the second mask 203.

Figure 39:
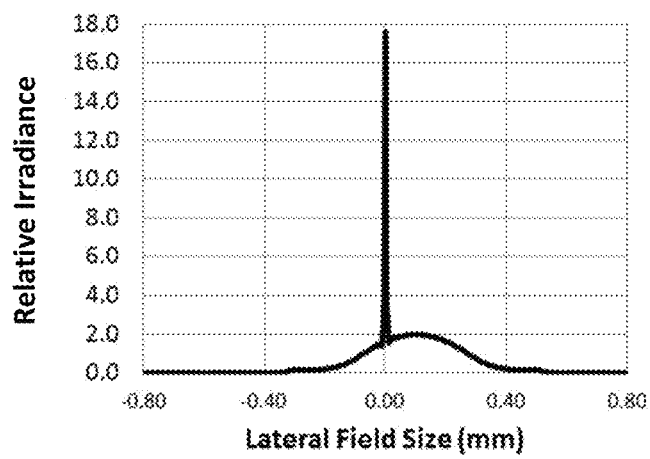
FIG. 39 presents a cross-section of the relative irradiance distribution of the enhanced electromagnetic radiation in the output plane of the optical system in the presence of both the first and the second masks within the system in accordance with the fourth embodiment of the present invention.

A significant irradiance increase in the output plane 205 of the optical system 200 is achieved when both the first 201 and the second 203 masks are present within the optical system. A cross-section of the enhanced irradiance distribution in the output plane 205 of the optical system 200 containing the two masks 201 and 203 is shown in FIG. 39. The highest irradiance increase in the output plane 205 in the presence of the two masks 201 and 203 within the optical system 200 is achieved when the radial size of the second phase mask region is equal to 0.185 mm. The increased irradiance produced in the output plane 205 with the two masks 201 and 203 located within the optical system 200 is approximately 17.6 times higher than the respective irradiance in the output plane of the system when the two masks are absent from the system. Similar irradiance enhancements in the output plane may be achieved by increasing the optical path difference of the first mask to $(0.5+j)\lambda$, where j is an integer. The attainable irradiance increase in the output plane 205 exceeds 90% of its maximum value when the radial size of the phase region of the second mask 203 is selected within the range of 0.145 mm and 0.245 mm.

Figure 40:
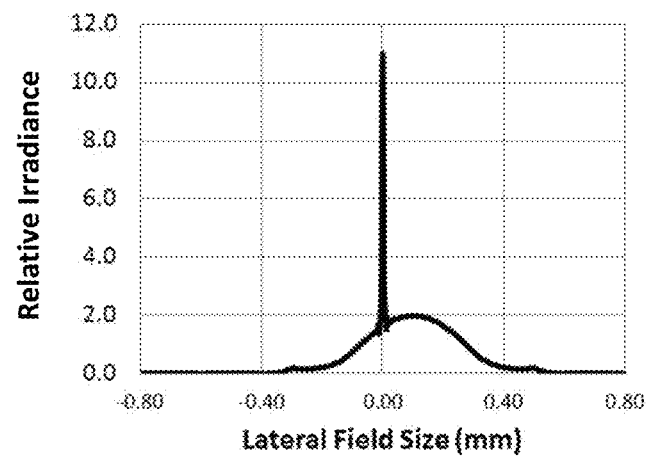
FIG. 40 presents a cross-section of the relative irradiance distribution of the enhanced electromagnetic radiation in the output plane of the optical system when the phase delay produced by the first mask is 0.264 π in accordance with the fourth embodiment of the present invention.
Figure 41:
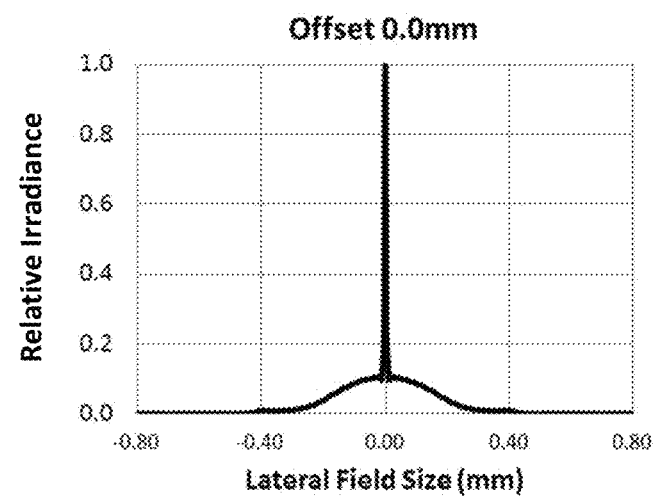
FIGS. 41 through 48 present cross-sections of the relative irradiance distributions of the enhanced electromagnetic radiation in the output plane when the first mask lateral position in the input plane is incrementally adjusted from 0.00 mm to 0.35 mm in 0.05 mm steps in accordance with the fourth embodiment of the present invention.
Figure 42:
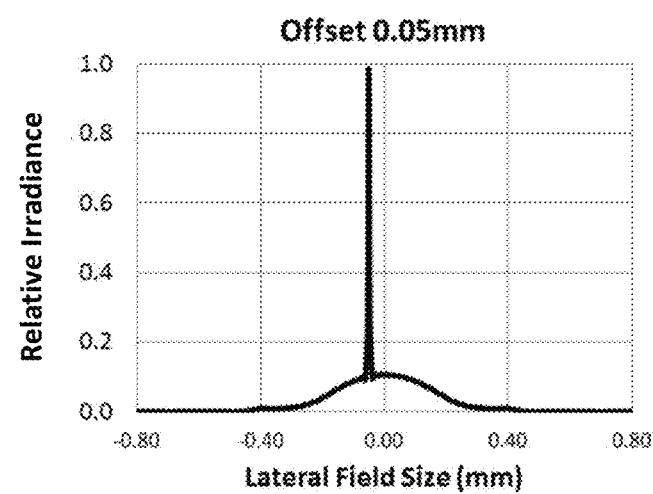
Figure 43:
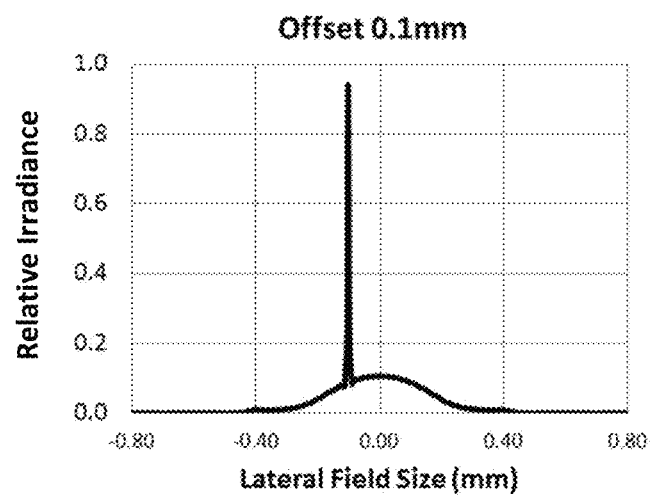
Figure 44:
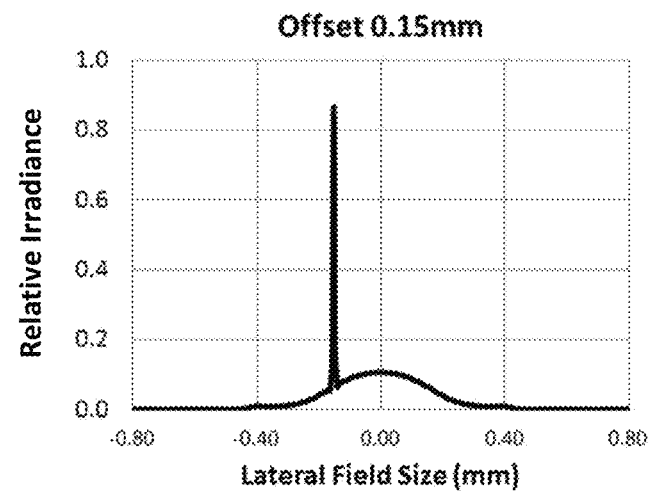
Figure 45:
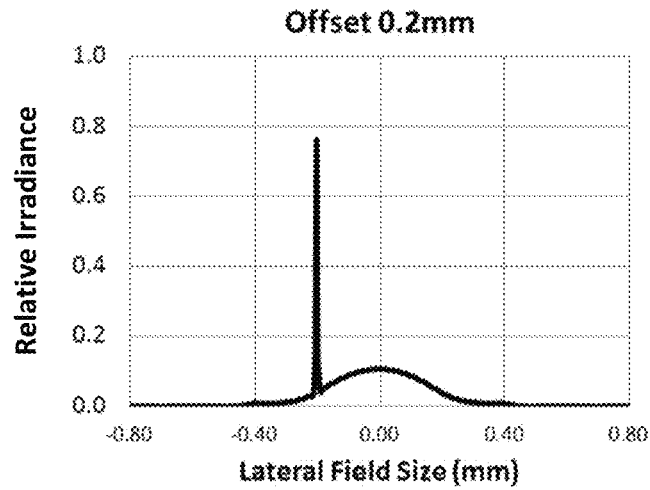
Figure 46:
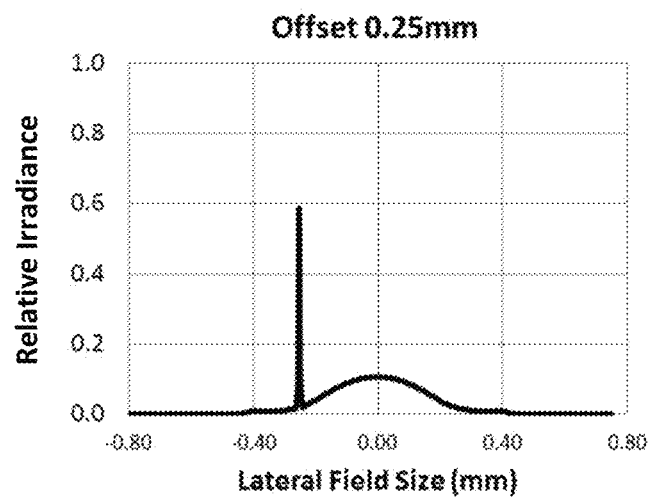
Figure 47:
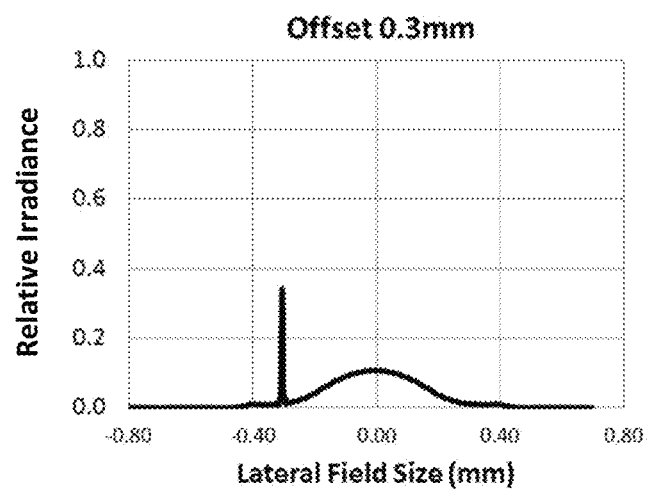
Figure 48:
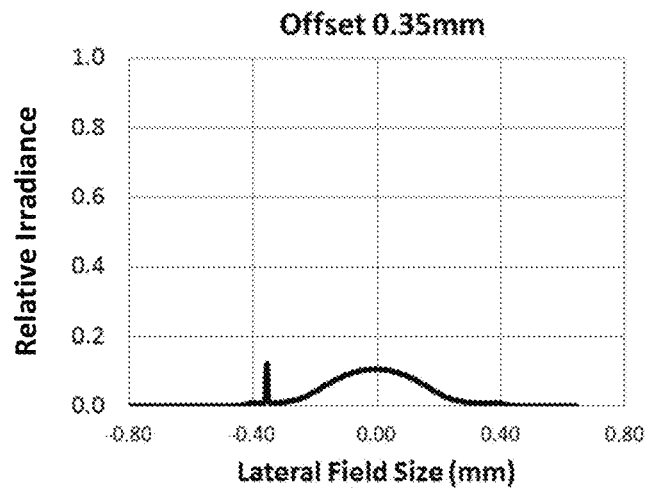

The increased irradiance within the output plane 205 can be controlled by adjusting the optical phase delays produced by the first mask 201. FIG. 40 presents the relative increase in the irradiance produced within the output plane of the optical system 200 with the first phase mask zone optical path delay reduced to 0.264λ. A similar irradiance increase in the output plane may be produced by increasing the optical path difference of the first mask regions to $(0.264+j)\lambda$ or to $(0.736+j)\lambda$, where j is an integer.

Lateral offsets of the first mask 201 within the input plane of the optical system 200 with respect to the electromagnetic radiation and the axis of the optical system 200 will produce respective lateral shifts of the localized high irradiance distributions in the output plane 205. This phenomenon can be effectively employed to produce lateral scans of high intensity within the output plane. The localized irradiance shifts within the output plane 205 are proportional to the respective lateral shifts of the first mask phase regions within the input plane, and also depend on the optical system magnification. The magnification M of the optical system 200 is equal to M=−1. Therefore, the lateral offset of the radiation in the output plane 205 is equal to the lateral offset of the first mask regions within the input plane, and occurs in the opposite direction.

The attainable irradiance increase in the output plane 205 depends on the magnitude of the lateral offset of the first mask regions within the input plane of the optical system 200.

Figure 49:
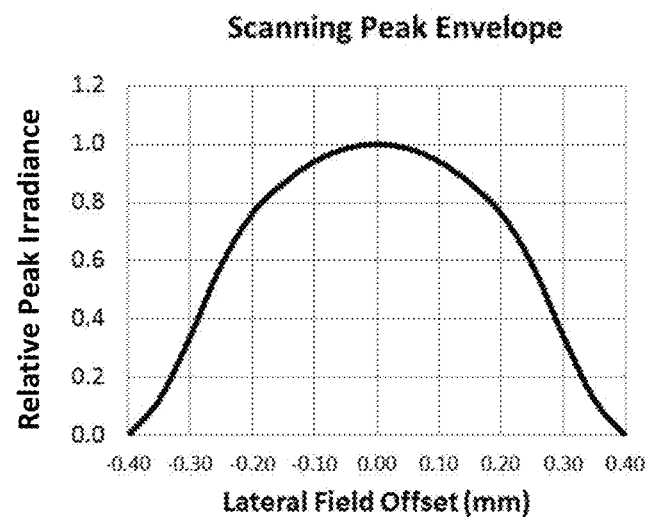
FIG. 49 presents the relative peak irradiance changes in the output plane of the optical system as a function of the first mask lateral offset within the input plane in accordance with the fourth embodiment of the present invention.
Figure 50:
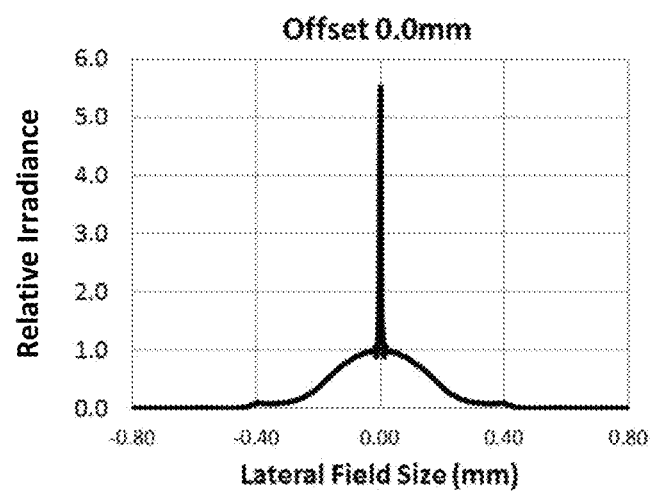
FIGS. 50 through 55 present relative cross sections of irradiance distributions with constant peak intensities during the lateral scans in the output plane of the optical system in accordance with the fourth embodiment of the present invention.
Figure 51:
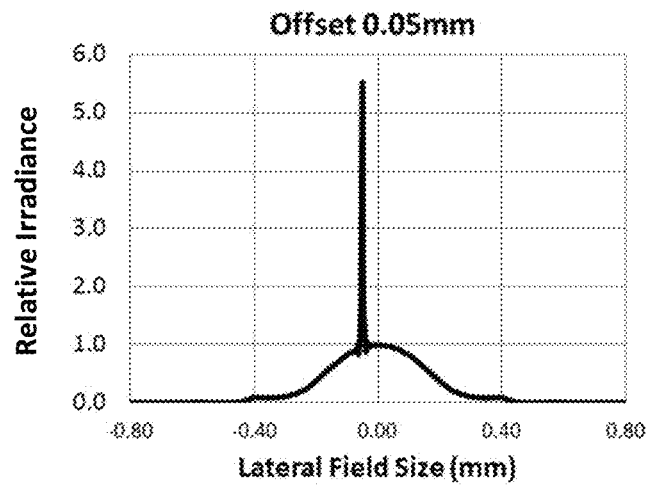
Figure 52:
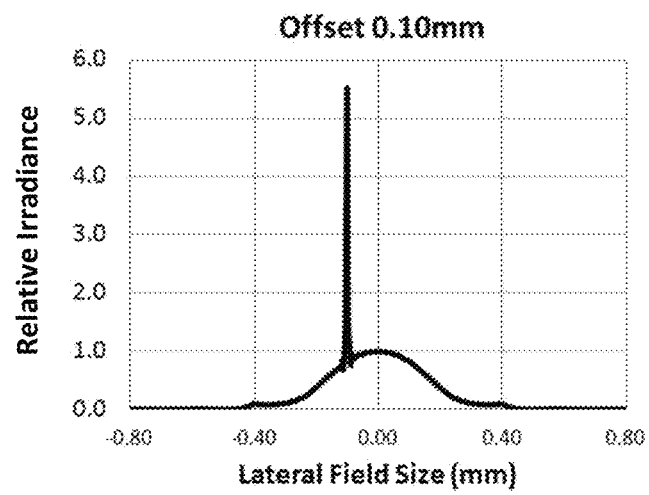
Figure 53:
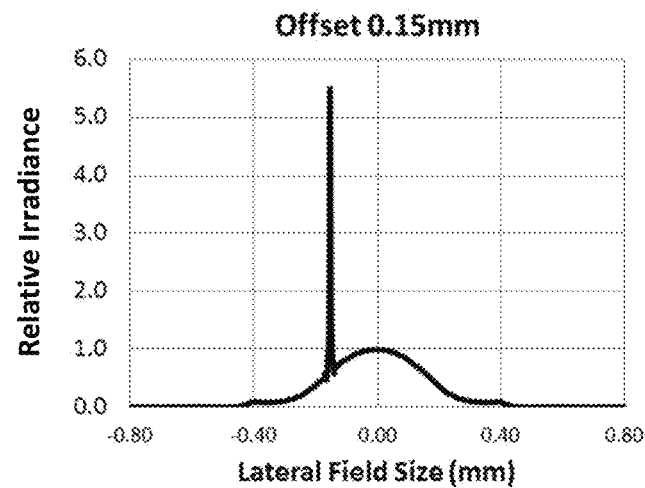
Figure 54:
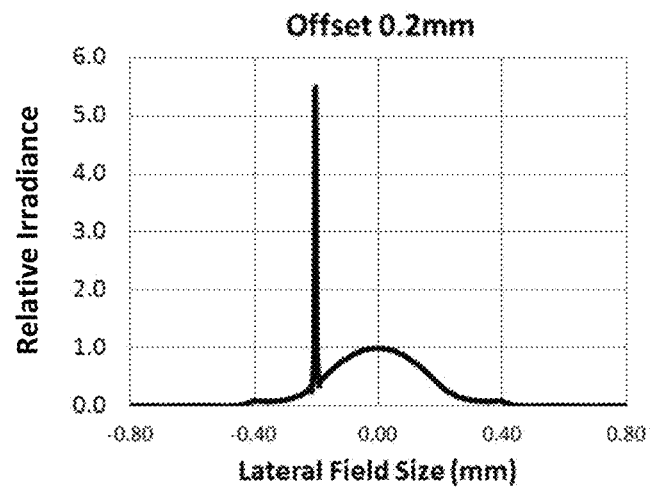
Figure 55:
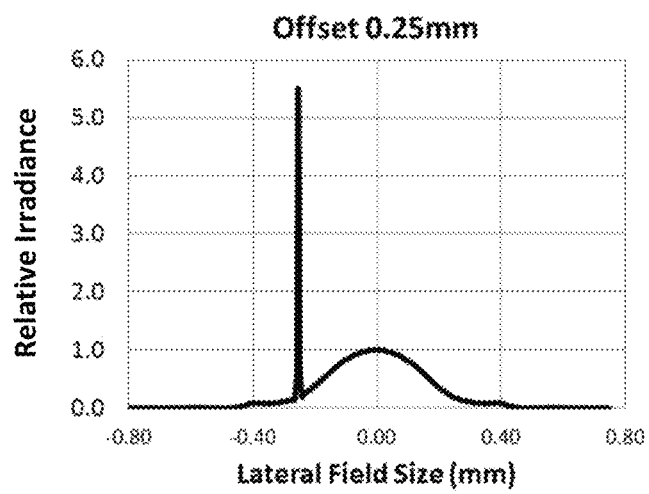

FIGS. 41 through 48 show changes in the position and relative irradiance peaks produced within the output plane, when the first mask 201 is incrementally offset from the optical axis of the system 200 within the input plane with a step size of 0.05 mm. FIG. 49 presents the relative changes in the electromagnetic radiation irradiance in the output plane of the optical system 200 as a function of the lateral offset of the first mask 201 within the input plane. The highest peak irradiance value in the output plane 205 in the presence of the two masks 201 and 203 within the optical system 200 is achieved when the first mask phase region offset is zero.

Figure 56:
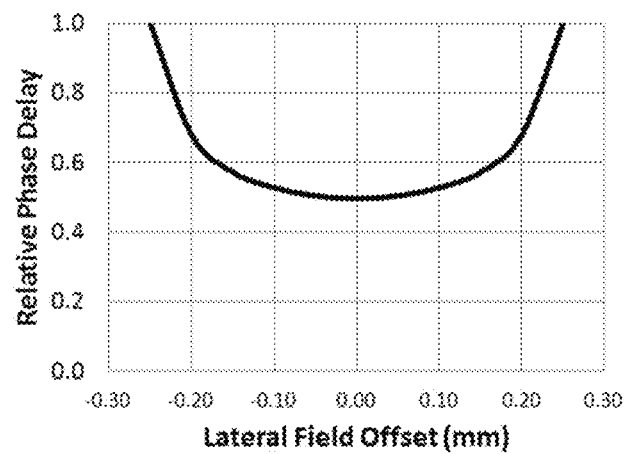
FIG. 56 presents the relative phase delay of the first phase mask structure as a function of the phase mask lateral position in the input plane required for maintaining the constant electromagnetic radiation peak intensities during the lateral scans across the output plane within the range of +/−0.25 mm in accordance with the fourth embodiment of the present invention.

In several applications it may be desirable to maintain the peak irradiance of the enhanced radiation in the output plane constant during the lateral scans. In accordance with the fourth embodiment of the present invention, this is achieved by adjusting the phase delays produced by the phase zone regions of the first mask 201 concurrently with the adjustments in the lateral position of the said regions within the input plane of the optical system 200. FIGS. 50 through 55 present the relative cross sections of the enhanced irradiance distributions produced in the output plane 205 of the optical system 200 when the lateral position of the first mask phase region is incrementally adjusted from 0.00 mm to 0.25 mm in 0.05 mm steps within the input plane, with concurrent adjustments in the optical phase delay of the said first phase mask region. The relative irradiance enhancement shown in the figures is maintained constant at 5.5 times the radiation background levels during the lateral scans within the range of +/−0.25 mm across the output plane. FIG. 56 shows the relative phase delay of the first phase mask region as a function of the phase mask lateral position in the input plane required for maintaining the constant output irradiance within the range of +/−0.25 mm.

Fifth Embodiment

Figure 57:
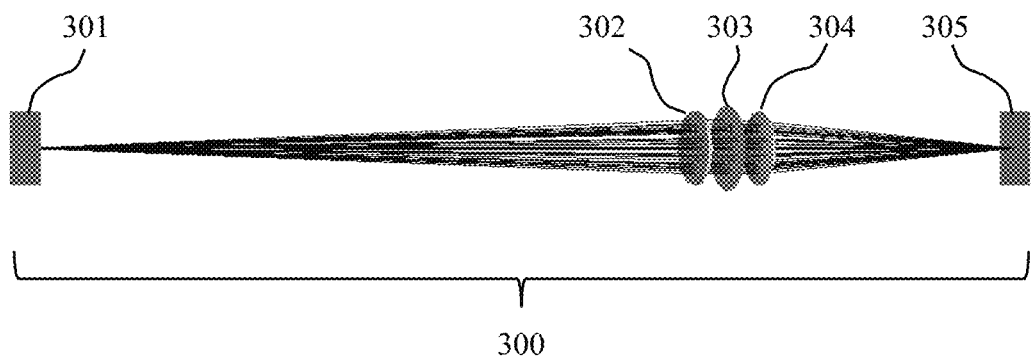
FIG. 57 presents a layout of a transmissive optical system for producing high irradiance distributions in the output plane in accordance with the fifth embodiment of the present invention.

The fifth embodiment of the present invention describes an electromagnetic irradiance enhancement technique produced with the aid of a transmissive optical system 300 shown in FIG. 57. The optical system 300 contains the first mask 301 located in the input plane, two lenses 302 and 304 displaced from each other along the axial direction, a second phase mask 303, and the output plane 305 where the irradiance enhancements are observed. The second mask 303 is located between the first lens 302 and the second lens 304 of the system. The second lens 304 is followed by the output plane 305.

A detailed prescription of the optical system 300 is shown in the following Tables 5 and 6:

TABLE 5

Optical prescription for the fifth embodiment

| Element | Vertex Radius of Curvature (mm) | Thickness (mm) | Glass |
|---|---|---|---|
| Object (Mask 301) | INFINITY | 120.000 | — |
| Surface 1 (Lens 302) | −139.787 | 1.000 | BK7 |
| Surface 2 (Lens 302) | −37.469 | 5.000 | — |
| Stop (Mask 303) | INFINITY | 5.000 | — |
| Surface 1 (Lens 304) | 46.634 | 1.000 | BK7 |
| Surface 2 (Lens 304) | −100.000 | 45.511 | — |
| Output plane305 | INFINITY | — | — |

TABLE 6

Aspheric coefficients for the fifth embodiment

| Element | K | A1 | A2 |
|---|---|---|---|
| Object (Mask 301) | 0.000 | 0.000 | 0.000 |
| Surface 1 (Lens 302) | 0.000 | 0.000 | 0.000 |
| Surface 2 (Lens 302) | −0.616 | 0.000 | 0.000 |
| Stop (Mask 303) | 0.000 | 0.000 | 0.000 |
| Surface 1 (Lens 304) | −1.001 | 4.062E−3 | −1.436E−6 |
| Surface 2 (Lens 304) | 0.000 | 0.000 | 0.000 |
| Output plane305 | 0.000 | 0.000 | 0.000 |

Figure 58:
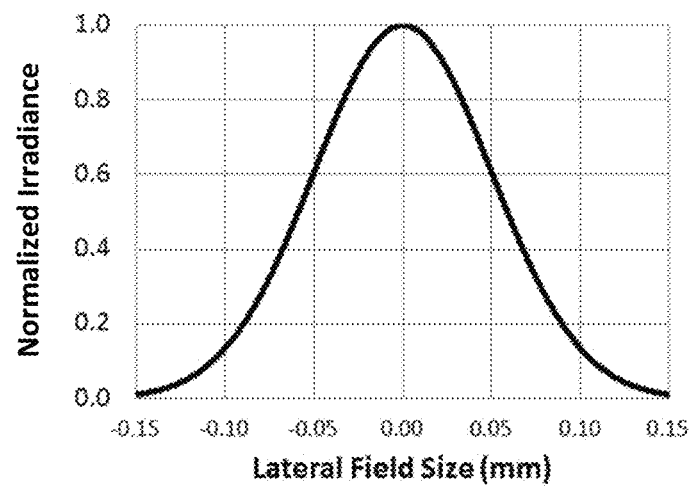
FIG. 58 presents a normalized irradiance cross-section of the axially-symmetric Gaussian-shaped electromagnetic radiation at the input plane of the optical system in accordance with the fifth embodiment of the present invention.

The electromagnetic radiation within the input plane is circular-symmetric Gaussian-shaped, with a beam parameter radius of 0.10 mm and radiation wavelength of $\lambda=0.001$ mm. The normalized irradiance cross-section of the Gaussian-shaped radiation at the input plane of the optical system 300 is shown in FIG. 58.

Figure 59:
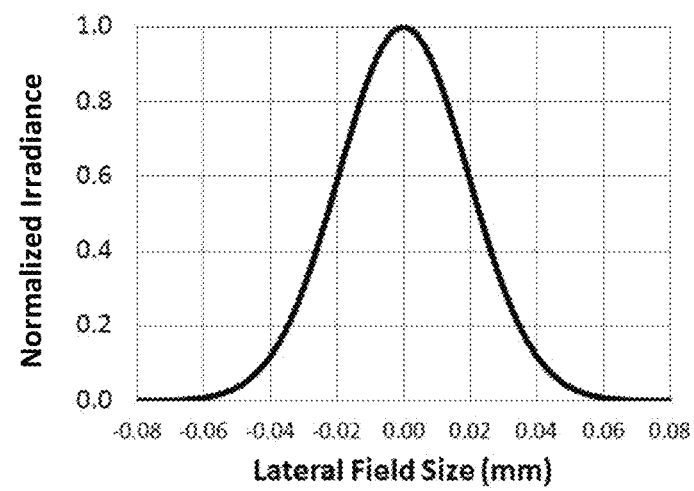
FIG. 59 presents a normalized irradiance cross-section of the axially-symmetric field distribution in the output plane of the optical system in the absence of the first and the second masks within the system in accordance with the fifth embodiment of the present invention.

When no masks are contained within the optical system 300, the field irradiance distribution after propagation through the optical system in the output plane 305 remains Gaussian-shaped. FIG. 59 shows the normalized irradiance cross-section of the field distribution in the output plane 305.

Figure 60:
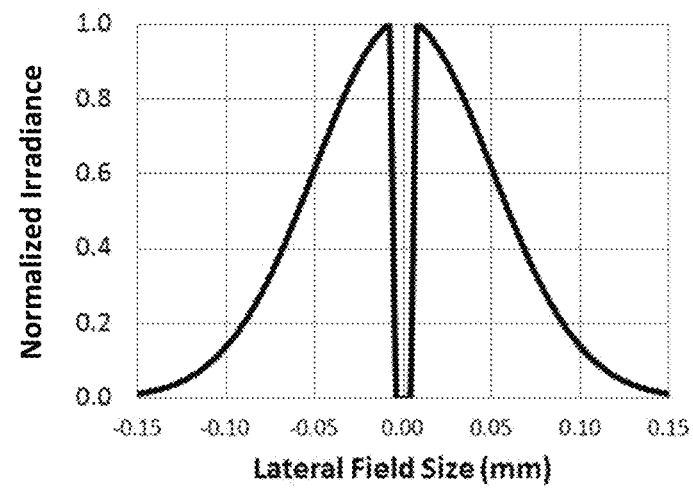
FIG. 60 presents a normalized cross-section of the input axially-symmetric irradiance distribution immediately after propagating through the first amplitude mask located in the input plane of the optical system in accordance with the fifth embodiment of the present invention.
Figure 61:
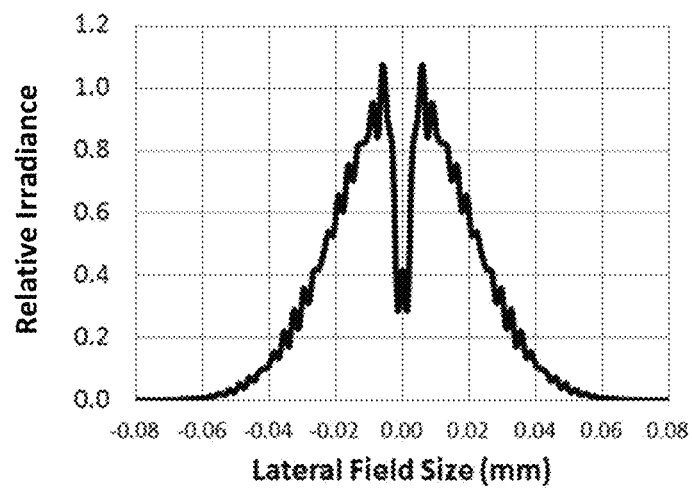
FIG. 61 presents a cross-section of the relative irradiance distribution of the electromagnetic radiation in the output plane of the optical system in the presence of only the first mask in the input plane in accordance with the fifth embodiment of the present invention.

The first amplitude mask 301 located at the input plane of the optical system 300 contains a square-shaped opaque region with a lateral size of 0.010 mm. FIG. 60 presents the normalized irradiance cross-section of the axially-symmetric Gaussian-shaped irradiance distribution immediately after propagating through the first amplitude mask 301 located in the input plane of the optical system 300. The figure shows the irradiance void in the center of the field produced by the opaque structure of the mask 301. When only the first mask 301 is present within the system 300, the output irradiance distribution in the output plane 305 contains the on-axis irradiance void due to the field obstruction by the first mask 301, and is shown in FIG. 61.

Figure 62:
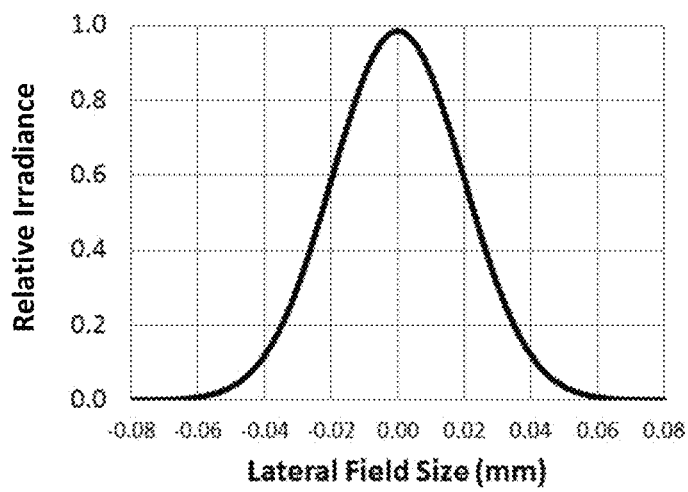
FIG. 62 presents a cross-section of the relative irradiance distribution of the electromagnetic radiation in the output plane of the optical system in the presence of only the second mask at the pupil of the system in accordance with the fifth embodiment of the present invention.

The electromagnetic radiation modified by the first mask 301 passes through the first lens 302 and is directed onto the second mask 303 located near the stop of the optical system 300. The second mask 303 is centered with respect to the optical axis of the system, and contains an axially symmetric central phase region with a radius of 0.850 mm. The central phase region of the second mask 303 produces a phase delay of 0.43 π to the propagating part of the electromagnetic radiation. The phase delay corresponds to the optical path difference OPD=0.43λ between the optical radiation propagating through the phase region and the rest of the radiation outside of the phase region. The phase region of the second mask 303 is composed of a phase relief profile fabricated onto the transparent phase mask substrate made of BK7 glass. The phase relief profile step h is calculated in accordance with equation (4). For the wavelength of the electromagnetic radiation $\lambda=0.001$ mm, the phase mask step corresponding to an OPD of 0.43 λ is equal to 0.8473 microns. When only the second mask 303 is present at the stop location of the optical system 300, the output irradiance distribution in the output plane 305 resembles the Gaussian shape, and is shown in FIG. 62. The peak irradiance shown in the figure is 98.6% of the respective peak irradiance in the output plane 305, when no masks are contained within the optical system 300.

Figure 63:
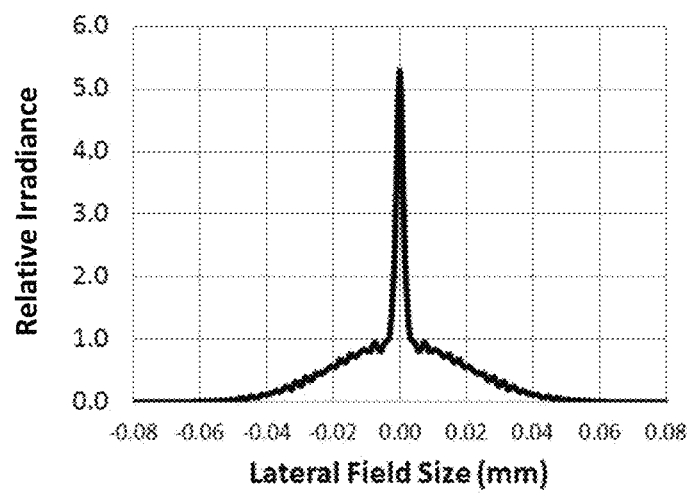
FIG. 63 presents a cross-section of the relative irradiance distribution of the electromagnetic radiation in the output plane of the optical system in the presence of both the first and the second masks within the system in accordance with the fifth embodiment of the present invention.

After propagating through the second phase mask 303 and the second lens 304, the electromagnetic radiation is directed onto the output plane 305 of the optical system, where the irradiance enhancements are observed. The output irradiance enhancements in the output plane 305 of the optical system 300 are achieved when both the first 301 and the second 303 masks are present in the system. The on-axis peak irradiance enhancement in the output plane 305 in the presence of the two masks 301 and 303 is 5.3 times the respective on-axis irradiance value when no masks are contained within the optical system, and is shown in FIG. 63.

Figure 64:
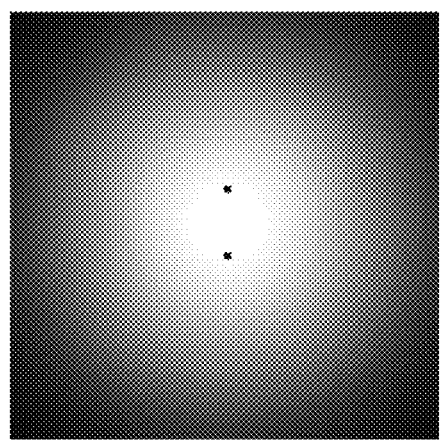
FIG. 64 presents a gray-scale two-dimensional irradiance distribution containing two small voids in the electromagnetic radiation immediately after the first amplitude mask in accordance with the fifth embodiment of the present invention.
Figure 65:
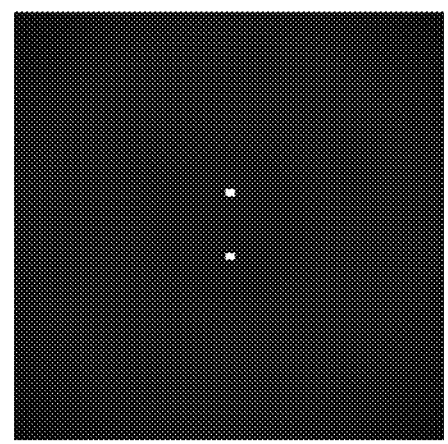
FIG. 65 presents a gray-scale two-dimensional irradiance distribution of electromagnetic radiation containing two high irradiance peaks at the output plane of the optical system corresponding to the two-dimensional irradiance distribution shown in FIG. 64, in accordance with the fifth embodiment of the present invention.

Multiple regions of increased irradiance can be produced in the output plane 305 by the respective selection of the locations and shapes of the first mask regions. The formation of two irradiance peaks in the output plane of the optical system 300 is shown in FIGS. 64 and 65. FIG. 64 shows a two-dimensional irradiance distribution at the output of the first mask 301 containing two small size irradiance voids due to the obstruction of the electromagnetic radiation by the respective two opaque first mask regions. FIG. 65 shows the enhanced two-dimensional irradiance distribution in the output plane of the optical system 300, corresponding to the irradiance distribution after the first mask 301 shown in FIG. 64. The two irradiance voids shown in FIG. 64 due to the obstruction of the electromagnetic radiation by the first mask are transformed into the respective two high irradiance peaks in the output plane.

Sixth Embodiment

The sixth embodiment of the present invention describes an electromagnetic radiation enhancement technique for producing low divergence high output radiance distributions at large distances from the optical system, also known as the far field.

Figure 66:
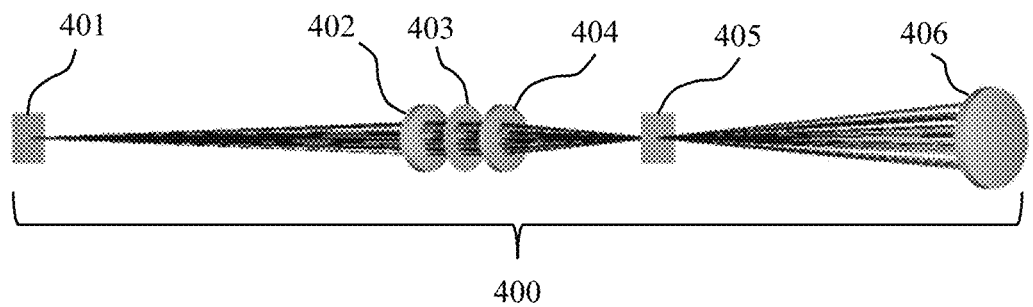
FIG. 66 presents a layout of an optical system for producing high radiance distributions in the far field in accordance with the sixth embodiment of the present invention.

FIG. 66 presents the layout of an optical system 400 for producing enhanced output radiance field distributions in the far field. The system 400 contains a first mask 401 located in the input plane of the optical system, a first lens 402 located after the first mask, a second phase mask 403 located after the lens 402, a second lens 404 located after the second mask 403, a third mask 405 located after the second lens 404, and a third lens 406 located at a focal distance from the third mask 405. Enhancements of the electromagnetic radiation are produced in the plane of the third mask 405 and in the far field after the third lens 406.

A detailed prescription of the optical system 400 is shown in the following Tables 7 and 8:

TABLE 7

Optical prescription for the sixth embodiment

| Element | Vertex Radius of Curvature (mm) | Thickness (mm) | Glass |
| --- | --- | --- | --- |
| Object (Mask 401) | INFINITY | 120.000 | — |
| Surface 1 (Lens 402) | −139.787 | 1.000 | BK7 |
| Surface 2 (Lens 402) | −37.469 | 5.000 | — |
| Stop (Mask 403) | INFINITY | 5.000 | — |
| Surface 1 (Lens 404) | 46.634 | 1.000 | BK7 |
| Surface 2 (Lens 404) | −100.000 | 45.516 | — |
| Intermediate plane (405) | INFINITY | 100.000 | — |
| Surface 1 (Lens 406) | 380.393 | 4.000 | BK7 |
| Surface 2 (Lens 406) | −59.913 | — | — |

TABLE 8

Aspheric coefficients for the sixth embodiment

| Element | K | A1 | A2 |
| --- | --- | --- | --- |
| Object (Mask 401) | 0.000 | 0.000 | 0.000 |
| Surface 1 (Lens 402) | 0.000 | 0.000 | 0.000 |
| Surface 2 (Lens 402) | −0.616 | 0.000 | 0.000 |
| Stop (Mask 403) | 0.000 | 0.000 | 0.000 |
| Surface 1 (Lens 404) | −1.001 | 4.062E−3 | −1.436E−6 |
| Surface 2 (Lens 404) | 0.000 | 0.000 | 0.000 |
| Intermediate plane (405) | 0.000 | 0.000 | 0.000 |
| Surface 1 (Lens 406) | 0.000 | 0.000 | 0.000 |
| Surface 2 (Lens 406) | −0.819 | 0.000 | 0.000 |

Figure 67:
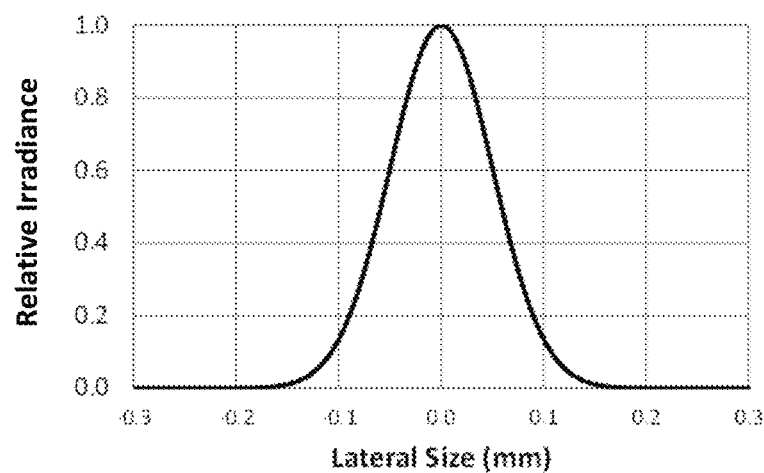
FIG. 67 presents a normalized irradiance cross-section of the axially-symmetric Gaussian-shaped electromagnetic radiation at the input plane of the optical system in accordance with the sixth embodiment of the present invention.

The electromagnetic radiation in the input plane of the optical system 400 is an axially-symmetric Gaussian-shaped distribution. The propagating radiation has a beam waist parameter value of 0.01 mm, and a wavelength of $\lambda=1.0$ microns. FIG. 67 presents a normalized irradiance cross-section of the propagating Gaussian field in the input plane of the optical system 400.

The first phase mask 401 of the optical system 400 is located in the input plane. The first mask 401 contains a square-shaped central phase region with a linear size of 0.010 mm. The phase delay introduced by the central phase region of the first mask 401 is $0.50\pi$, corresponding to the optical path difference of $0.50\lambda$ between the fraction of the field propagating through the central region and the rest of the mask. The second phase mask 403 of the optical system 400 is radially-symmetric, with a radial size of the mask central region of 0.880 mm. The phase delay introduced by the central region of the second mask 403 is $0.56\pi$, corresponding to the optical path difference between the fraction of the radiation propagating through the central region and the rest of the mask of $0.56\lambda$. The second mask 403 is placed at the stop location of the optical system 400.

Figure 68:
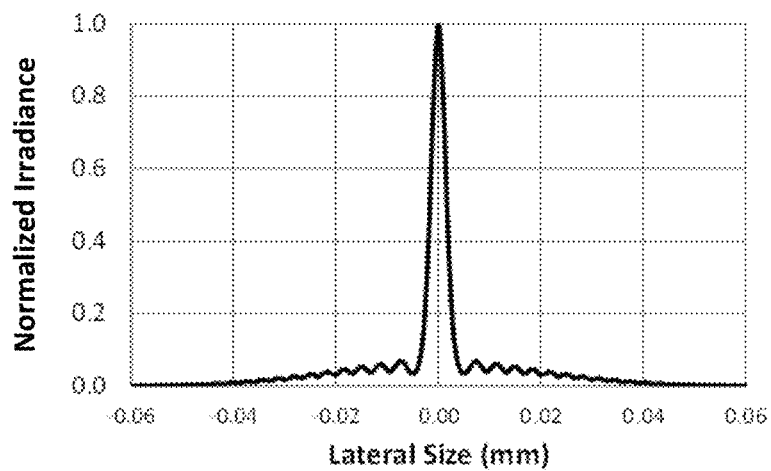
FIG. 68 presents a cross-section of the normalized irradiance distribution of the enhanced electromagnetic radiation in the intermediate output plane of the optical system in the presence of both the first and the second masks within the system in accordance with the sixth embodiment of the present invention.
Figure 69:
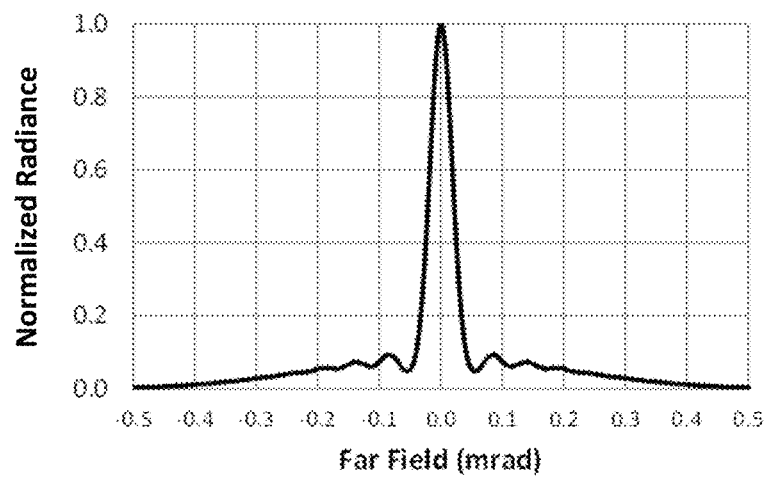
FIG. 69 presents a cross-section of the normalized far field radiance distribution of the output enhanced electromagnetic radiation in the presence of both the first and the second masks within the system in accordance with the sixth embodiment of the present invention.

The electromagnetic radiation strength enhancements in accordance with the sixth embodiment of the present invention are produced in the plane of the third mask 405 and after the lens 406 in the far field of the optical system. Electromagnetic radiation with increased localized irradiance is produced in the plane of the third mask 405, while electromagnetic radiation with increased localized radiance is produced in the far field. FIG. 68 shows the cross-section of the enhanced irradiance distribution within the plane of the third mask 405. When the third mask 405 is absent from the system, electromagnetic radiation propagates through the third lens 406 located at the focal distance from the plane of the third mask 405, and results in an enhanced radiance distribution in the far field, as shown in FIG. 69.

The presence of the third mask 405 within the optical system 400 provides additional flexibility in controlling the output radiance in the far field. The third mask selectively controls the angular distribution of the electromagnetic radiation in the far field of the system, and may contain amplitude structures, phase structures, or their combinations.

Figure 70:
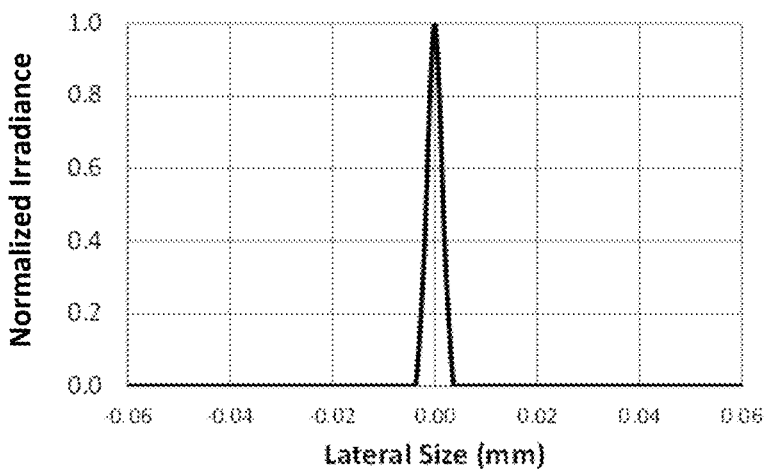
FIG. 70 presents a cross-section of the normalized irradiance distribution of the electromagnetic radiation immediately after a spatial filter located in the intermediate output plane of the optical system in the presence of both the first and the second masks within the system in accordance with the sixth embodiment of the present invention.
Figure 71:
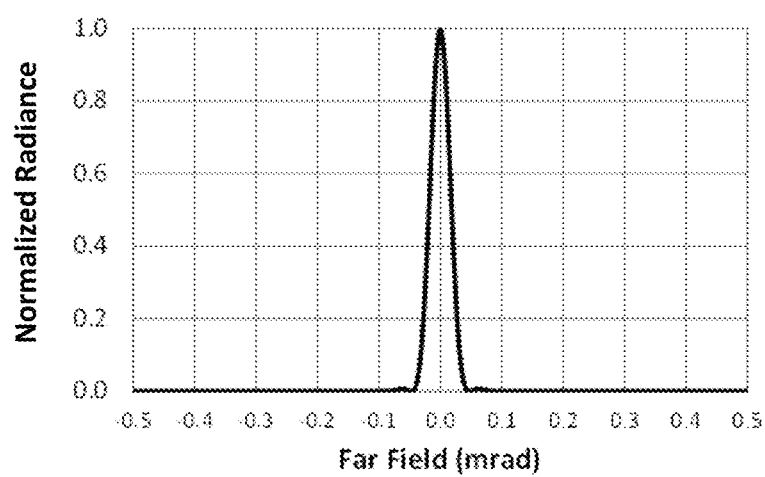
FIG. 71 presents a cross-section of the normalized far field radiance distribution of the spatially filtered output electromagnetic radiation in the presence of both the first and the second masks within the system in accordance with the sixth embodiment of the present invention.

In accordance with the sixth embodiment of the present invention, the third mask acts as a spatial filter and contains an aperture with a diameter of 0.007 mm. The mask aperture is centered with respect to the irradiance peak in the plane of the mask. The aperture size and location are selected to block the radiation background and transmit only the narrow peak of the enhanced radiation. A cross-section of the enhanced irradiance distribution immediately after the third mask is shown in FIG. 70. The enhanced radiation further propagates through the third lens 406 located at a focal distance from the third mask 405, and results in a high radiance low divergence field distribution with suppressed radiation background in the far field, as shown in FIG. 71.

What is claimed is:

1. An optical system for producing electromagnetic radiation with localized increases in irradiance or radiance at the system output based on diffraction of said radiation by spatially localized amplitude and phase structures within at least two non-conjugate spatial locations, comprising:
a first optical mask containing localized regions for producing controlled, localized modifications of phase delays and/or amplitude attenuations of a fraction of the electromagnetic radiation and located within said first non-conjugate spatial location of the optical system;
at least a single optical element with positive optical power located after said first spatial location;
at least one additional optical mask located after said optical element at non-conjugate location placed within the far field region with respect to location of the said first mask and containing localized regions for producing controlled localized modifications of a fraction of the electromagnetic radiation; and a system output where said high output intensity peaks of electromagnetic radiation are produced.

2. The optical system in accordance with claim 1, wherein said optical element with positive optical power is constituted by at least one lens.

3. The optical system in accordance with claim 1, wherein said optical element with positive optical power is constituted by at least one mirror.

4. The optical system in accordance with claim 1, wherein said optical element with positive optical power is constituted by a combination of lenses and mirrors.

5. The optical system in accordance with claim 1, wherein said first optical mask contains localized transmissive regions.

6. The optical system in accordance with claim 5, wherein said first optical mask contains a means to locally adjust the phase delay and/or amplitude attenuation of electromagnetic radiation within said localized transmissive regions.

7. The optical system in accordance with claim 5, wherein the phase delay produced by said localized transmissive regions of the first optical mask equals $j\lambda/2$, where j is an odd integer, and $\lambda$ is the radiation wavelength.

8. The optical system in accordance with claim 1, wherein said first mask contains localized reflective regions.

9. The optical system in accordance with claim 8, wherein said first optical mask contains means for locally adjusting the phase delay and/or reflectivity of the incoming radiation within the said localized reflective regions.

10. The optical system in accordance with claim 8, wherein the phase delay produced by said localized reflective regions of the first optical mask equals $j\lambda/2$, where j is an odd integer, and $\lambda$ is the radiation wavelength.

11. The optical system in accordance with claim 1, wherein said at least one additional optical mask, placed within the far field region with respect to the said first mask, contains localized transmissive regions.

12. The optical system in accordance with claim 11, wherein said at least one additional optical mask placed within the far field region with respect to the said first mask contains means for locally adjusting the phase delay of the radiation within said localized transmissive regions.

13. The optical system in accordance with claim 1, wherein said at least one additional optical mask placed within the far field region with respect to the said first mask contains localized reflective regions.

14. The optical system in accordance with claim 13, wherein said at least one additional optical mask placed within the far field region with respect to the said first mask contains means for locally adjusting the phase delay of the reflected radiation within the said localized reflective regions.

15. The optical system in accordance with claim 1, containing a means for adjusting the lateral position of said first optical mask within the said first location of the optical system.

16. The optical system in accordance with claim 1, wherein said at least one additional optical mask placed within the far field region with respect to the said first mask is located at the stop of the optical system.

17. The optical system in accordance with claim 1, wherein the localized phase delay of the radiation produced by the said at least one additional optical mask placed within the far field region with respect to the said first mask equals $j\lambda/2$, where j is an odd integer, and $\lambda$ is the radiation wavelength.

18. The optical system in accordance with claim 1, containing at least one optical element having optical power and located after said at least one additional optical mask placed within the far-field region with respect to said first optical mask.

19. The optical system in accordance with claim 18, wherein said at least one optical element having optical power is placed at a focal distance after said at least one additional optical mask.

20. The optical system in accordance with claim 18, further comprising at least one additional optical mask located after said at least one optical element with optical power.

21. The optical system in accordance with claim 20, wherein said at least one additional optical mask is located after said at least one optical element with optical power at the conjugate location with respect to the first optical mask.

22. The optical system in accordance with claim 21, wherein said at least one additional optical mask is located at the focal plane of said at least one additional optical element with optical power.

23. The optical system in accordance with claim 20, containing an optical element having optical power and located after said at least one additional optical mask.

24. The optical system in accordance with claim 23, wherein said optical element having optical power is located at the focal distance after said at least one additional optical mask.

25. The optical system in accordance with claim 1, wherein the said system output where high output intensity peaks of electromagnetic radiation are produced is remotely located in the far field of said optical system.

* * * * *